(12) United States Patent
Choi et al.

(10) Patent No.: US 12,230,510 B2
(45) Date of Patent: Feb. 18, 2025

(54) SUBSTRATE TREATING APPARATUS AND METHOD FOR THE SAME

(71) Applicant: SEMES CO., LTD., Chungcheongnam-do (KR)

(72) Inventors: Byoung Doo Choi, Chungcheongnam-do (KR); Jin Ho Choi, Incheon (KR)

(73) Assignee: SEMES CO., LTD., Cheonan-si (KR)

( * ) Notice: Subject to any disclaimer, the term of this patent is extended or adjusted under 35 U.S.C. 154(b) by 605 days.

(21) Appl. No.: 17/566,874

(22) Filed: Dec. 31, 2021

(65) Prior Publication Data

US 2022/0205100 A1 Jun. 30, 2022

(30) Foreign Application Priority Data

Dec. 31, 2020 (KR) .......................... 10-2020-0189124

(51) Int. Cl.
*H01L 21/47* (2006.01)
*H01L 21/67* (2006.01)

(52) U.S. Cl.
CPC ........ *H01L 21/47* (2013.01); *H01L 21/67023* (2013.01)

(58) Field of Classification Search
CPC ............... H01L 21/47; H01L 21/67023; H01L 21/67051; H01L 21/6715; H01L 21/67706; H01L 21/67742; B05B 13/0278; B05B 15/50; B08B 3/02; B08B 9/023; G03F 7/162
USPC ....................................................... 134/198
See application file for complete search history.

(56) References Cited

U.S. PATENT DOCUMENTS

| 7,891,365 B2 | 2/2011 | Hirao et al. |
| 2001/0003966 A1* | 6/2001 | Kitano ................ H01L 21/6715 |
| | | 118/300 |
| 2008/0023034 A1* | 1/2008 | Hirao .................... B05B 15/557 |
| | | 134/186 |

(Continued)

FOREIGN PATENT DOCUMENTS

| CN | 105276307 A | * | 1/2016 | ............ A61M 39/10 |
| CN | 110385218 A | | 10/2019 | |

(Continued)

OTHER PUBLICATIONS

Machine translation of CN-105276307-A (Year: 2016).*

*Primary Examiner* — David G Cormier
*Assistant Examiner* — Thomas Bucci
(74) *Attorney, Agent, or Firm* — Procopio, Cory, Hargreaves & Savitch LLP

(57) ABSTRACT

A substrate treating apparatus is disclosed. The substrate treating apparatus includes a treating container having a treatment space to treat a substrate, a standby port positioned at one side of the treating container to allow a nozzle, which discharges a treatment liquid, to stand by, and a liquid supplying unit moving between the treating container and the standby port and having the nozzle. The standby port includes a nozzle receiving member including a nozzle receiving unit having a receiving space formed inside the nozzle receiving unit to receive the nozzle and a cleaning liquid and a discharge part having a discharge port provided at one side of the nozzle cleaning unit to discharge the cleaning liquid to the nozzle. The discharge port is provided to overlap at least a portion of the nozzle when viewed from above.

17 Claims, 16 Drawing Sheets

(56) References Cited

U.S. PATENT DOCUMENTS

| | | | | |
|---|---|---|---|---|
| 2009/0114253 | A1* | 5/2009 | Matsumoto | H01L 21/67034 134/30 |
| 2010/0051059 | A1* | 3/2010 | Kometani | H01L 21/6715 134/21 |
| 2010/0098869 | A1* | 4/2010 | Kinoshita | H01L 21/6715 427/421.1 |
| 2013/0319470 | A1* | 12/2013 | Kai | H01L 21/67051 134/22.12 |
| 2014/0352730 | A1* | 12/2014 | Kai | H01L 21/67051 134/104.1 |
| 2016/0008840 | A1* | 1/2016 | Sasagawa | B01F 23/45 239/142 |
| 2017/0128962 | A1* | 5/2017 | Kashiyama | B05B 3/02 |
| 2018/0061678 | A1* | 3/2018 | Miura | H01L 21/6715 |
| 2019/0317408 | A1 | 10/2019 | Goo et al. | |
| 2020/0038897 | A1* | 2/2020 | Kamimura | H01L 21/6708 |

FOREIGN PATENT DOCUMENTS

| | | | |
|---|---|---|---|
| JP | 2010062352 | A | 3/2010 |
| JP | 2013243284 | A | 12/2013 |
| JP | 2013251409 | A | 12/2013 |
| JP | 2016162865 | A | 9/2016 |
| JP | 2017092239 | A | 5/2017 |
| JP | 2019079886 | A | 5/2019 |
| KR | 1020030036957 | A | 5/2003 |
| KR | 1020070113145 | A | 11/2007 |
| KR | 20080110007 | A | 12/2008 |
| KR | 1020140048179 | A | 4/2014 |
| KR | 1020160104599 | A | 9/2016 |
| KR | 102099114 | B1 | 10/2019 |
| KR | 20190117201 | A | 10/2019 |
| KR | 1020210042628 | A | 4/2021 |

* cited by examiner

SUBSTRATE TREATING APPARATUS AND METHOD FOR THE SAME

CROSS-REFERENCE TO RELATED APPLICATIONS

A claim for priority under 35 U.S.C. § 119 is made to Korean Patent Application No. 10-2020-0189124 filed on Dec. 31, 2020, in the Korean Intellectual Property Office, the entire contents of which are hereby incorporated by reference.

BACKGROUND

Embodiments of the inventive concept described herein relate to a substrate treating apparatus and a method for the same.

To fabricate a semiconductor device, various processes, such as a cleaning, depositing, photolithography, etching, and ion implanting processes. Among them, the photolithography process includes a coating process of coating a photosensitive liquid, such as a photoresist, onto a substrate to form a photoresist layer on the substrate, an exposure process of transferring a circuit pattern onto a layer formed on the substrate, and a developing process of selectively removing the exposed region or an inverse region of the exposed region from the substrate.

A liquid treating process, a nozzle is positioned at a position facing the substrate to supply a treatment liquid onto the substrate during the liquid treating process, and stands by in a standby port before and after the liquid treating process. The standby port includes a common body including a receiving space, and a plurality of nozzles are received in a receiving space of the common body. The plurality of nozzles received in the receiving space discharge the cleaning liquid toward the discharge end of the nozzle while standing by, and the discharge end and the peripheral portion are cleaned together.

However, even if a region, which faces a port to discharge the cleaning liquid, of the nozzle is cleaned, an opposite side of the region may not be smoothly cleaned.

In addition, the plurality of nozzles discharge the treatment liquid, such as photoresist, to the common body while standing by. A larger amount of mist produced during the process of discharging the treatment liquid to the common body may contaminate a surrounding nozzle.

In addition, as the plurality of nozzles received in the nozzle receiving space are simultaneously cleaned, even a nozzle, which does not need to be cleaned, is cleaned, so the cleaning liquid for the nozzle is excessively used.

SUMMARY

Embodiments of the inventive concept provide a substrate treating apparatus capable of individually or selectively cleaning a plurality of nozzles.

Embodiments of the inventive concept provide a substrate treating apparatus capable of cleaning the entire surface of a nozzle.

Embodiments of the inventive concept provide a substrate treating apparatus capable of preventing a nozzle from being contaminated while the nozzle is standing by.

Embodiments of the inventive concept provide a substrate treating apparatus capable of preventing a cleaning liquid from leaking from a supplying pipe which is to supply a nozzle cleaning liquid into a standby port.

Embodiments of the inventive concept provide a substrate treating apparatus capable of adjusting the water level of a cleaning liquid received in a standby port and of preventing the cleaning liquid from flowing over the standby port.

Embodiments of the inventive concept provide a substrate treating apparatus capable of preventing a discharge rate of a cleaning liquid from being lagged, when the cleaning liquid after cleaning the nozzle is discharged Embodiments of the inventive concept provide a method for treating a substrate capable of preventing photoresist in a nozzle pipe from being cured.

The objects which will be achieved in the inventive concept are not limited to the above, but other objects, which are not mentioned, will be apparently understood to those skilled in the art.

The inventive concept discloses a substrate treating apparatus.

The substrate treating apparatus includes a treating container having a treatment space for treating a substrate, a standby port positioned at one side of the treating container to allow a nozzle, which discharges a treatment liquid, to stand by, and a liquid supplying unit moving between the treating container and the standby port and having the nozzle. The standby port includes a nozzle receiving member including a nozzle cleaning unit having a receiving space formed inside the nozzle cleaning unit to receive the nozzle and a cleaning liquid and a discharge part having a discharge port provided at one side of the nozzle cleaning unit to discharge the cleaning liquid to the nozzle. The discharge port is provided to overlap at least a portion of the nozzle when viewed from above.

The cleaning liquid supplied from the discharge port may rotate along an outer surface of the nozzle and a wall of the nozzle receiving unit.

The cleaning liquid discharged from the discharge port may rotate to a surface, which is positioned at an opposite side in a discharge direction of the cleaning liquid, of the outer surface of the nozzle.

A plurality of nozzle cleaning units are provided, positioned to be mutually independent from each other, and arranged in one direction when viewed from above.

The standby port may include an anti-overflow holes provided to communicate with a plurality of nozzles cleaning units in a direction perpendicular to the arrangement direction of the plurality of nozzle cleaning units.

The standby port may include a pipe fixing member coupled to the nozzle receiving member to fix a cleaning liquid supplying pipe to supply the cleaning liquid to the discharge port, and the pipe fixing member may include a pipe insertion hole into which the cleaning liquid supplying pipe is inserted, and an anti-leakage groove (structure) formed in the pipe insertion hole.

The discharge port may include a coupling part protruding from a side surface of the nozzle receiving member, in which the cleaning liquid supplying pipe is coupled to the coupling part. The coupling part may include a first part having a first width and a second part extending from the first part and having a width smaller than the first width. The diameter of the pipe insertion hole may be provided to be less than a width of an end of the second part of the coupling part.

The nozzle receiving member may include an anti-movement groove (structure) provided in a bottom surface of the nozzle receiving member. The anti-movement groove (structure) may extend along the circumference of the nozzle cleaning unit and the anti-overflow hole.

The nozzle receiving member may include a discharge part positioned under the nozzle cleaning unit. The discharge part may include a first port extending downward from a lower end of the nozzle cleaning unit and a second port extending downward from the first port and having a width increased in a direction away from the first port. The angle between the first port and the second port may be provided as an obtuse angle.

The length of the first port in a vertical direction may be provided to be less than an inner diameter of the discharge end of the nozzle.

The treatment liquid may include photoresist, and the cleaning liquid may include thinner.

The inventive concept discloses a substrate treating apparatus.

The substrate treating apparatus includes a treating container having a treatment space for treating a substrate, a standby port positioned at one side of the treating container to allow a nozzle, which discharges a treatment liquid, to stand by, and a liquid supplying unit moving between the treating container and the standby port and having the nozzle. The standby port includes a nozzle receiving member including a nozzle cleaning unit having a receiving space formed inside the nozzle cleaning unit to receive the nozzle and a cleaning liquid and a discharge part having a discharge port provided at one side of the nozzle cleaning unit to supply the cleaning liquid to the nozzle. The discharge port is provided to overlap at least a portion of the nozzle and may be provided at one side from the central axis of the nozzle when viewed from above.

The cleaning liquid supplied from the discharge port may rotate along an outer surface of the nozzle, and the cleaning liquid may rotate to a surface, which is positioned at an opposite side in a discharge port direction of the cleaning liquid, of the outer surface of the nozzle.

A plurality of nozzle cleaning units are provided, positioned to be mutually independent from each other, and arranged in one direction when viewed from above.

The standby port may include an anti-overflow hole provided to communicate with the plurality of nozzle cleaning units in a direction perpendicular to an arrangement direction of the plurality of nozzle cleaning units and an anti-movement groove (structure) provided in a bottom surface of the nozzle receiving member. The anti-movement groove (structure) may extend along the circumference of the nozzle cleaning unit and the anti-overflow hole.

The standby port may include a pipe fixing member coupled to the nozzle receiving member to fix a cleaning liquid supplying pipe to supply the cleaning liquid to the discharge port, and the pipe fixing member may include a pipe insertion hole into which the cleaning liquid supplying pipe is inserted, and an anti-leakage groove (structure) formed in the pipe insertion hole.

The treatment liquid may include photoresist, and the cleaning liquid may include thinner.

The inventive concept discloses a method for treating a substrate by using the substrate treating apparatus.

The method for treating the substrate includes forming a first gas layer at a discharge end of a nozzle, as the nozzle sucks back a treatment liquid filled in the discharge end of the nozzle before moving into a standby port, cleaning the discharge end by inserting the discharge end into a receiving space in the state that the first gas layer is formed, forming a liquid layer, as the discharge end sucks back the cleaning liquid in the state that the discharge end is dipped into the cleaning liquid, and forming a second gas layer at the discharge end, as the nozzle sucks back in the state that the cleaning liquid is discharged from the receiving space. In the cleaning of the discharge end, the cleaning liquid is discharged such that the cleaning liquid rotates to a surface, which is positioned at an opposite side in a discharge direction of the discharge port, of the outer surface of the nozzle.

In the cleaning of the discharge end, the discharge end is cleaned, as the receiving space is filled with the cleaning liquid discharged through the nozzle. The nozzle is inserted into the receiving space such that the discharge end is dipped into the cleaning liquid filled in the receiving space in the state in which the first gas layer is formed.

The treatment liquid may include photoresist, and the cleaning liquid may include thinner.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
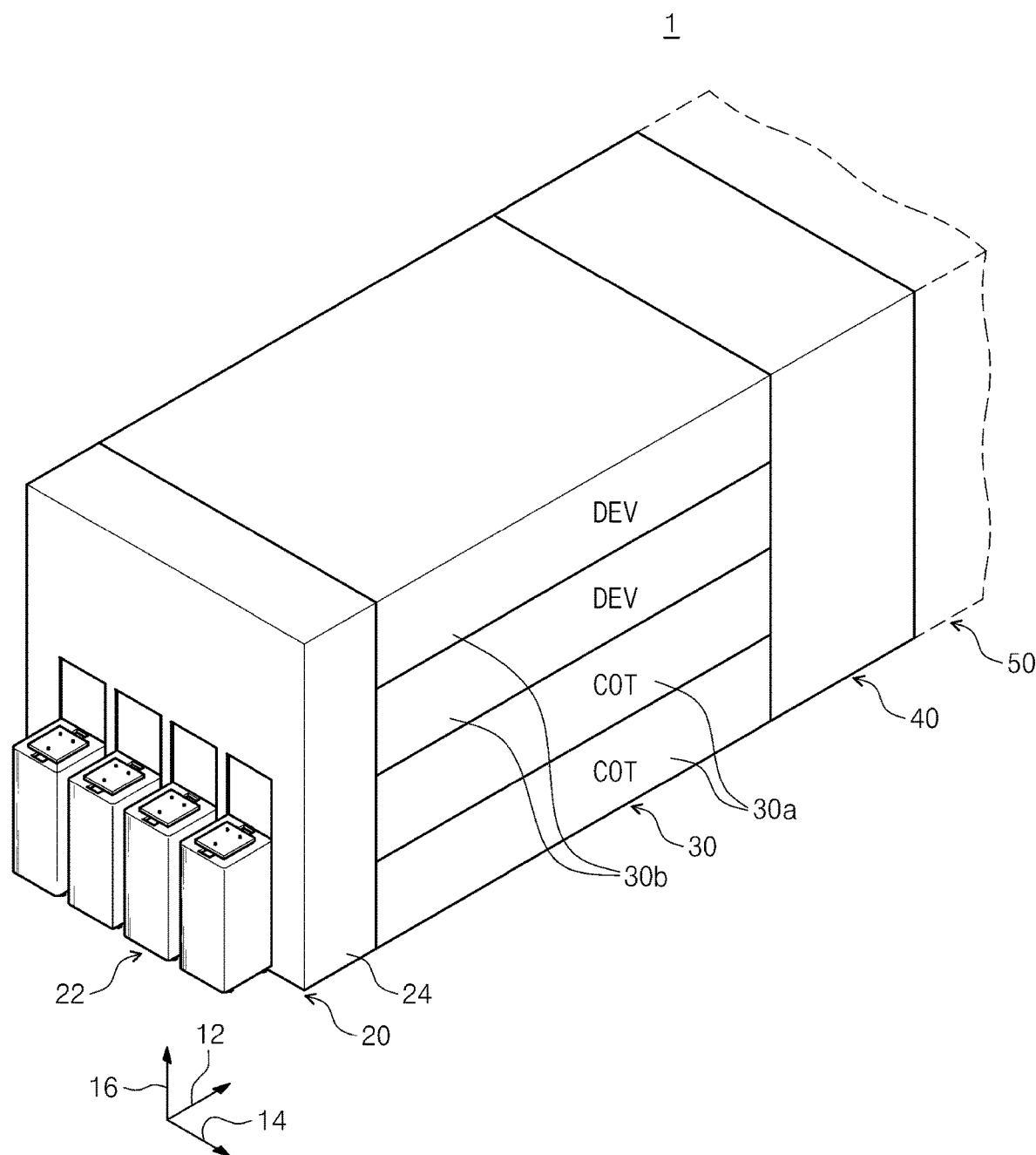
FIG. 1 is a view schematically illustrating an apparatus for treating a substrate, according to an embodiment of the inventive concept.

Hereinafter, the embodiment of the inventive concept will be described in detail with reference to accompanying drawings to allow those skilled in the art to easily reproduce the inventive concept. However, the inventive concept may be implemented in various forms, and is limited to embodiments described herein. In addition, in the following description of the inventive concept, a detailed description of well-known art or functions will be ruled out in order not to unnecessarily obscure the gist of the inventive concept. In addition, parts performing similar functions and similar operations will be assigned with the same reference numerals throughout the drawings.

When a certain part "includes" a certain component, the certain part does not exclude other components, but may further include other components if there is a specific opposite description. In detail, It will be further understood that the terms "comprises," "comprising," "includes," or "including," or "having" specify the presence of stated features, numbers, steps, operations, components, parts, or the combination thereof, but do not preclude the presence or addition of one or more other features, numbers, steps, operations, components, components, and/or the combination thereof.

The singular forms are intended to include the plural forms unless the context clearly indicates otherwise. In addition, the shapes and the sizes of elements in accompanying drawings will be exaggerated for more apparent description.

The term "and/or" includes any and all combinations of one or more of associated components. In addition, in the present specification, the wording "connected" indicates not only a direction connection between a member A and a member B, but also an indirect connection between the member A and the member B, as a member C is interposed between the member A and the member B.

The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

A controller (illustrated) may control the overall operation of a substrate treating apparatus. The controller (not illustrated) may include a central processing unit (CPU), a read only memory (ROM), and a random access memory (RAM). The CPU executes a desired treatment process, such as liquid treatment or a drying treatment, depending on various recipes stored in a storage region. The recipe has a process time, process pressure, a process temperature, and various gas flow rates which are control information of a device for a process condition, which is input thereto. Meanwhile, the recipe indicating the program or the treatment condition may be memorized in a hard disc or a semiconductor memory. In addition, the recipe may be set at a specific position in a storage area while being received in a portable computer-readable storage medium such as a CD-ROM or DVD.

The substrate treating apparatus according to the present embodiment may be used to perform a photolithograph process form a circular substrate. In particular, according to the present embodiment, the substrate treating apparatus may be used to be connected to the exposure device to perform a coating process and a developing process. However, the technical spirit of the inventive concept is not limited thereto, but may be used in various types of processes of supplying a treatment liquid to a substrate while rotating the substrate. The following description will be made while focusing on that a wafer is used as a substrate.

Hereinafter, an embodiment of the inventive concept will be described with reference to FIGS. 1 to 18.

Figure 2:
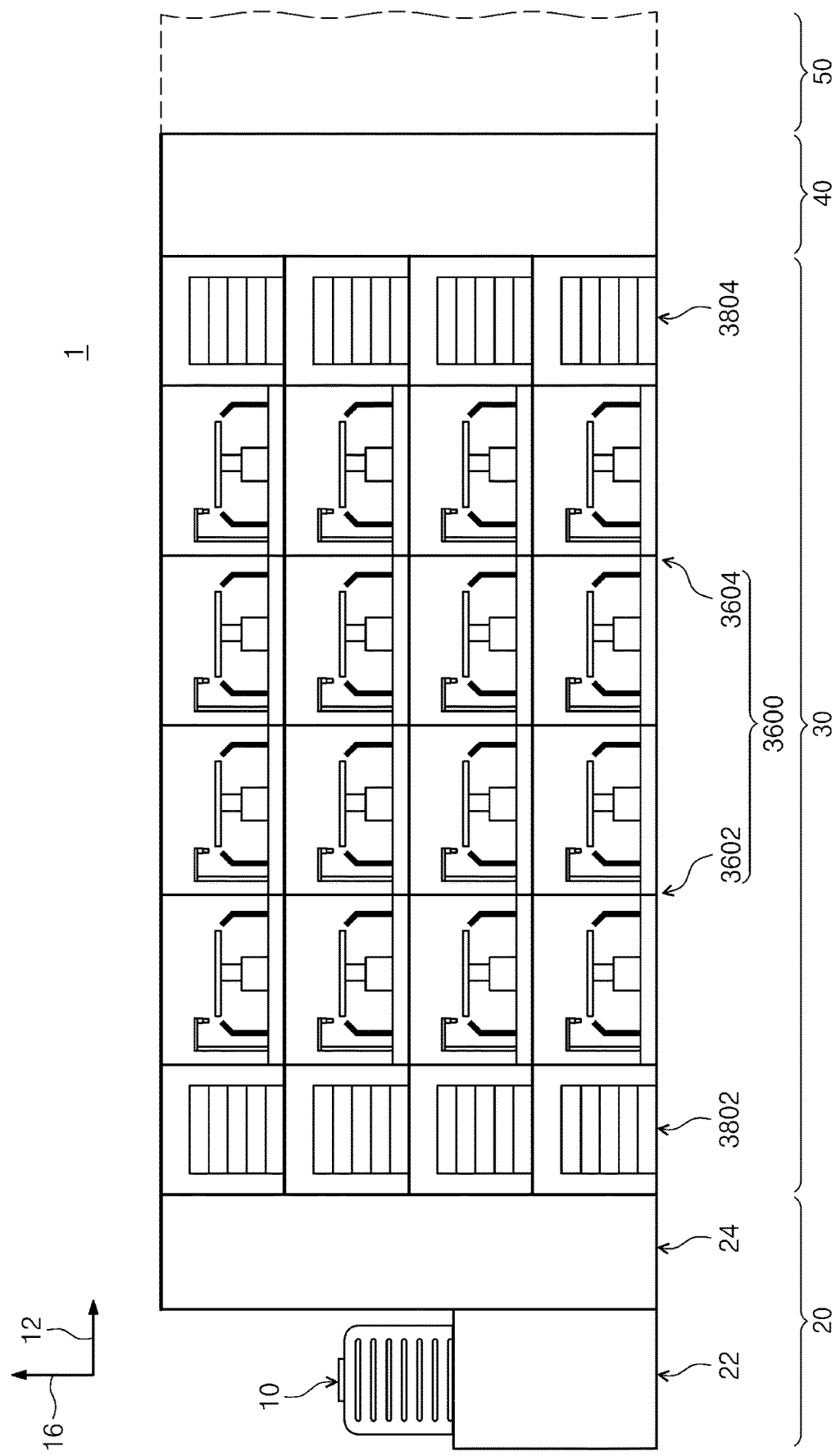
FIG. 2 is a sectional view of a substrate processing apparatus, which illustrates a coating block or a developing block of FIG. 1.
Figure 3:
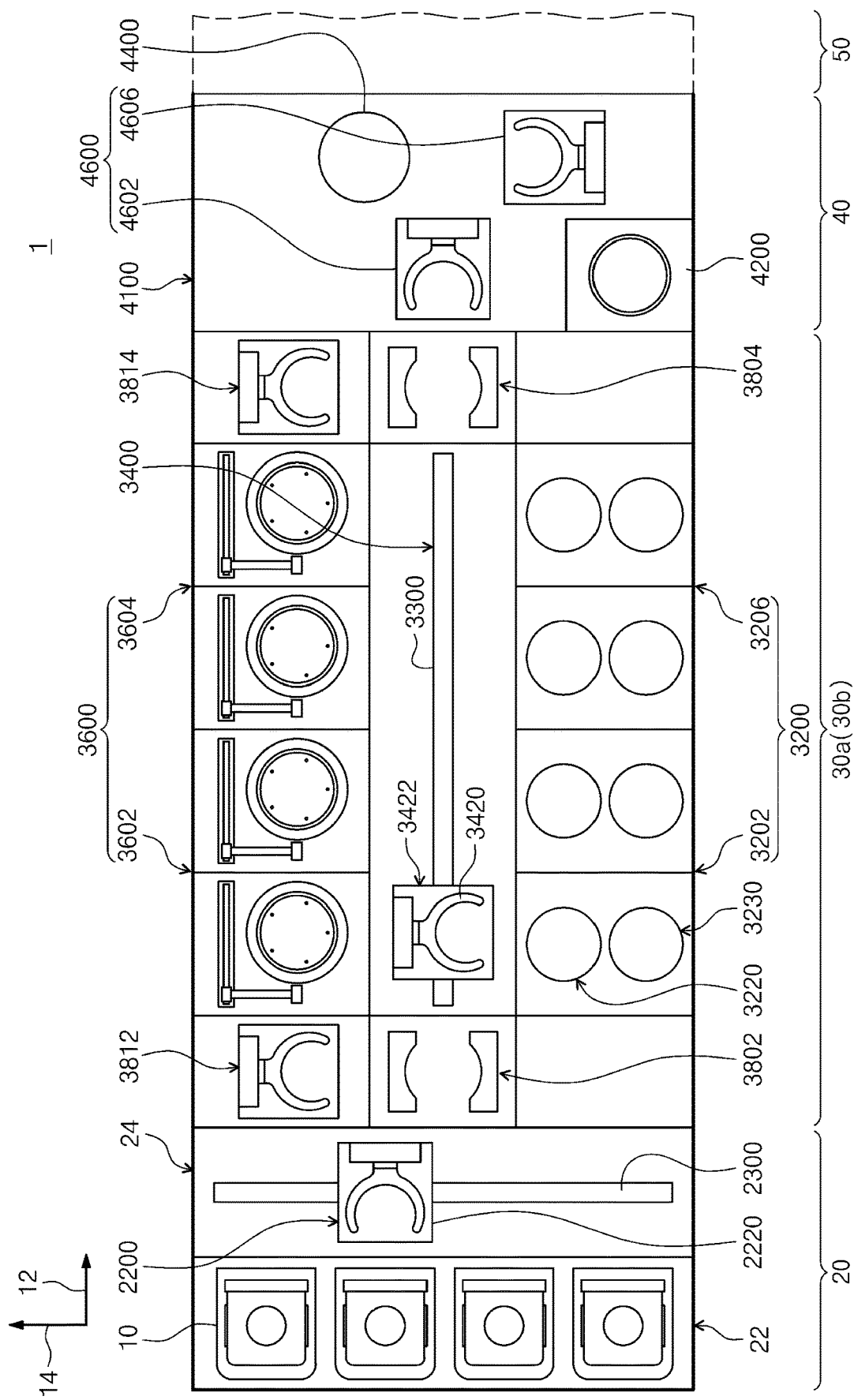
FIG. 3 is a plan view illustrating a substrate treating apparatus of FIG. 1.

FIG. 1 is a perspective view schematically illustrating a substrate treating apparatus according to an embodiment of the inventive concept, FIG. 2 is a cross-sectional view of a substrate treating apparatus, which illustrates a coating block or a developing block of FIG. 1, and FIG. 3 is a plan view of a substrate treating apparatus of FIG. 1.

Referring to FIGS. 1 to 3, according to an embodiment of the inventive concept, a substrate treating apparatus 1 includes an index module 20, a treating module 30, and an interface module 40. According to an embodiment, the index module 20, the treating module 30, and the interface module 40 are sequentially aligned in line with each other. Hereinafter, a direction in which the index module 20, the treating module 30, and the interface module 40 are arranged will be referred to as a first direction 12, a direction that is perpendicular to the first direction 12 when viewed from above will be referred to as a second direction 14, and a direction perpendicular to all the first direction 12 and the second direction 14 will be referred to as a third direction 16.

The index module 20 transfers a substrate 'W' to the treating module 30 from a container 10 in which the substrate 'W' is received, and a substrate 'W' completely treated is received into the container 10. The longitudinal direction of the index module 20 is provided in the second direction 14. The index module 20 has a loadport 22 and an index frame 24. The loadport 22 is positioned at an opposite side of the treating module 30, based on the index frame 24. The container 10 having substrates 'W' are placed on the loadport 22. A plurality of load ports 22 may be provided and may be arranged in the second direction 14.

The container 10 may include a container 10 for sealing such as a front open unified pod (FOUP). The container 10 may be placed on the loadport 22 by a transport unit (not illustrated) such as Overhead Transfer, Overhead Conveyor, or Automatic Guided Vehicle, or a worker.

An index robot 2200 is provided inside the index frame 24. A guide rail 2300, which has a longitudinal direction provided in the second direction 14, may be provided in the index frame 24, and the index robot 2200 may be provided to be movable on the guide rail 2300 The index robot 2200 may include a hand 2220 in which the substrate 'W' is positioned, and the hand 2220 may be provided to be movable forward and backward, rotatable about the third direction 16, and movable in the third direction 16.

The treating module 30 performs coating and developing processes with respect to the substrate 'W'. The treating module 30 has a coating block 30*a* and a developing block 30*b*. The coating block 30*a* forms a coating process with respect to the substrate 'W', and the developing block 30*b* performs a developing process with respect to the substrate 'W'. A plurality of coating blocks 30*a* are provided and stacked on each other. A plurality of developing blocks 30*b* are provided, and stacked on each other. According to an embodiment of FIG. 1, two coating blocks 30*a* are provided and two developing blocks 30*b* are provided. The coating blocks 30*a* may be disposed under the developing blocks 30*b*. According to an example, two coating blocks 30*a* may be subject to the same process and may be provided in the same structure. In addition, two developing blocks 30*a* may be subject to the same process and may be provided in the same structure.

Referring to FIG. 3, the coating block 30*a* has a heat treating chamber 3200, a transferring chamber 3400, a liquid treating chamber 3600, and a buffer chamber 3800. The heat treating chamber 3200 performs a heat treatment process with respect to the substrate 'W'. The heat treatment process may include a cooling process and a heating process. The liquid treating chamber 3600 supplies a liquid onto the substrate 'W' to form a liquid film. The liquid film may be a photoresist film or an anti-reflective film. The transferring chamber 3400 transfers the substrate 'W' between the heat treating chamber 3200 and the liquid treating chamber 3600 inside the coating block 30*a*.

The transferring chamber 3400 has a longitudinal direction parallel to the first direction 12. A transferring robot 3422 is provided in the transferring chamber 3400. The transferring robot 3422 transfers the substrate 'W' among the heat treating chamber 3200, the liquid treating chamber 3600, and the buffer chamber 3800. According to an example, the transferring robot 3422 may include a hand 3420 in which the substrate 'W' is positioned, and the hand 3420 may be provided to be movable forward and backward, rotatable about the third direction 16, and movable in the third direction 16. A guide rail 3300, which has a longitudinal direction parallel to the second direction 12, is provided in the transferring chamber 3400, and the transferring robot 3422 may be provided to be movable on the guide rail 3300.

Figure 4:
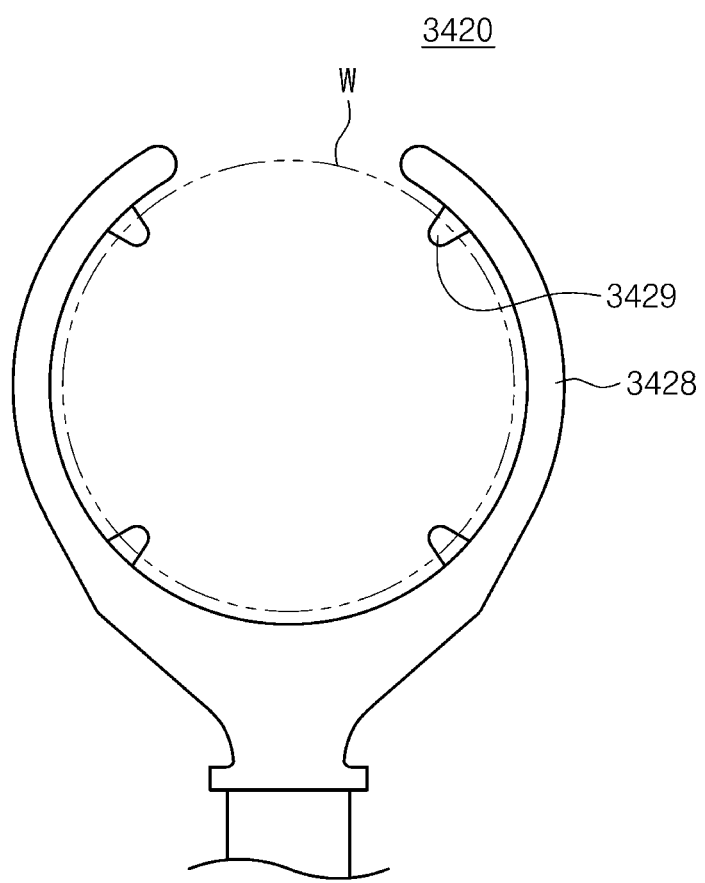
FIG. 4 is a view illustrating a hand of a transferring unit of FIG. 3.

FIG. 4 is a view illustrating a hand of a transferring unit of FIG. 3.

Referring to FIG. 4, the hand 3420 has a base 3428 and a supporting protrusion 3429. The base 3428 may have an annular ring shape in which a part of the circumference is bent. The base 3428 has an inner diameter greater than the diameter of the substrate 'W'. The supporting protrusion 3429 extends inward from the base 3428. A plurality of supporting protrusions 3429 are provided to support an edge area of the substrate 'W'. According to an example, four supporting protrusions 3429 may be provided at equal distances.

A plurality of heat treating chambers 3200 are provided. The heat treating chambers 3200 are arranged in the first direction 12. The heat treating chambers 3200 are positioned at one side of the transferring chamber 3400.

Figure 5:
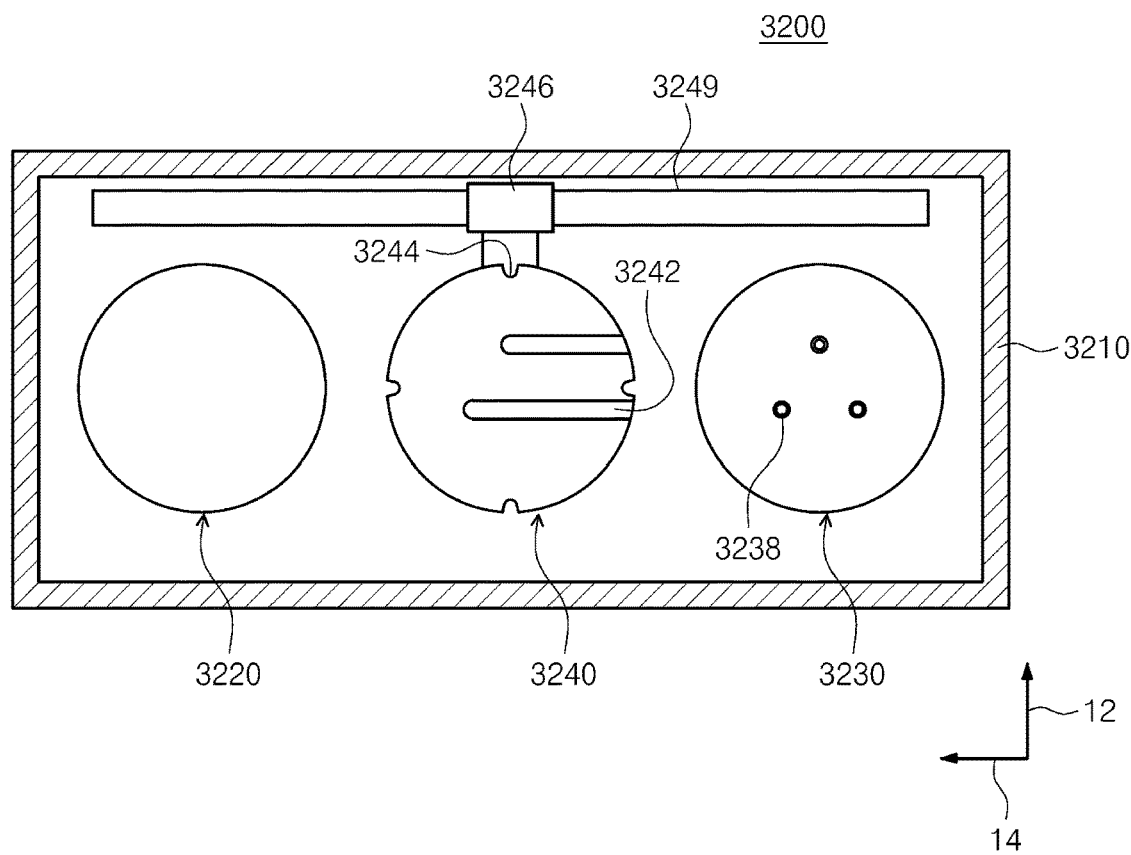
FIG. 5 is a plan view schematically illustrating a heat treating chamber of FIG. 3.
Figure 6:
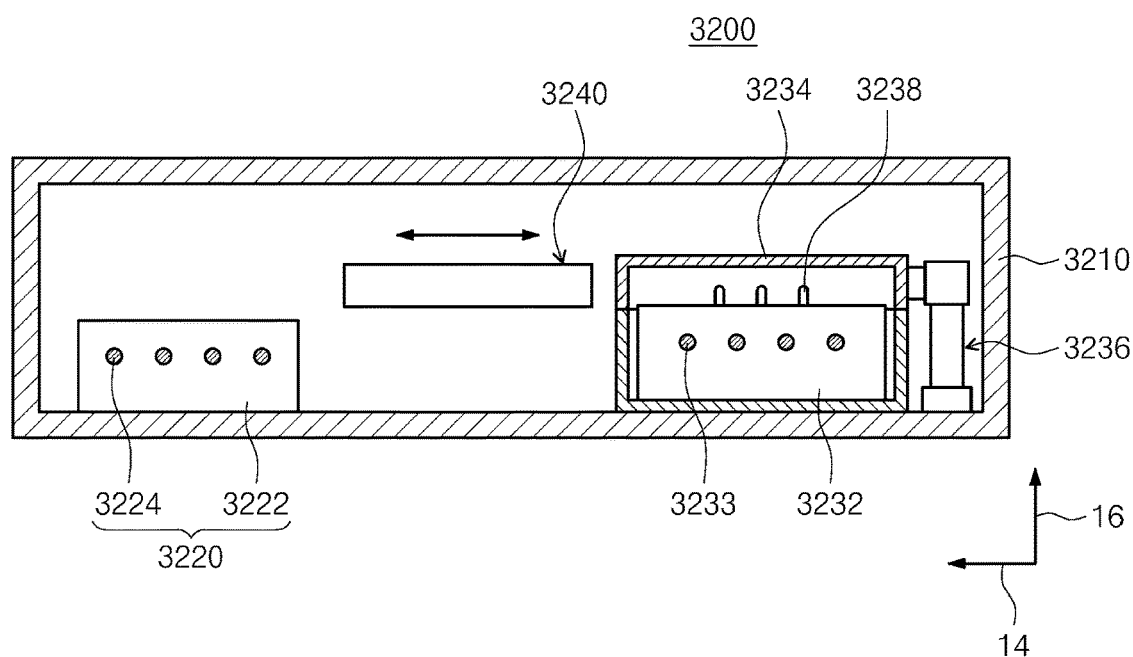
FIG. 6 is a front view illustrating a heat treating chamber of FIG. 5.

FIG. 5 is a plan view schematically illustrating a heat treating chamber of FIG. 3, and FIG. 6 is a front view illustrating the heat treating chamber of FIG. 5.

Referring to FIGS. 5 and 6, the heat treating chamber 3200 has a housing 3210, a cooling unit 3220, a heating unit 3230, and a transferring plate 3240.

The housing 3210 substantially has a rectangular parallelepiped shape. The housing 3210 is formed in a sidewall thereof with an entrance (not illustrated) to introduce or withdraw the substrate 'W'. The entrance may be maintained in an open sate. A door (not illustrated) may be provided to selectively open or close the entrance. The cooling unit 3220, the heating unit 3230, and the transferring plate 3240 are provided in the housing 3210. The cooling unit 3220 and the heating unit 3230 are provided side by side along the second direction 14. According to an embodiment, the cooling unit 3220 may be positioned more closely to the transferring chamber 3400 than the heating unit 3230.

The cooling unit 3220 has a cooling plate 3222. The cooling plate 3222 may have a substantially circular shape when viewed from above. The cooling plate 3222 has a cooling member 3224. According to an embodiment, the cooling member 3224 may be formed inside the cooling plate 3222 to serve as a fluid passage through which a cooling fluid flows.

The heating unit 3230 has a heating plate 3232, a cover 3234, and a heater 3233. The heating plate 3232 may have a substantially circular shape when viewed from above. The heating plate 3232 may has a diameter larger than that of the substrate 'W'. The heater 3233 is placed in the heating plate 3232. The heater 3233 may be provided in the form of a heating resistor to which a current is applied. Lift pints 3238 are provided on the heating plate 3232 to be driven vertically along the third direction 16. The lift pin 3238 receives the substrate 'W' from the transfer unit outside the heating unit 3230 to place the substrate 'W' on the heating plate 3232 or lifts the substrate 'W' from the heating plate 3232 to transmit the substrate 'W' to the transfer unit outside the heating unit 3230. According to an embodiment, three lift pins 3238 may be provided. The cover 3234 has an inner space having an open lower portion. The cover 3234 is positioned at an upper portion of the heating plate 3232 and moved in a vertical direction by a driver 3236. When the cover 3234 makes contact with the heating plate 3232, the space surrounded by the cover 3234 and the heating plate 3232 are provided as a heating space for heating the substrate 'W'.

The transferring plate 3240 is provided in the shape of a substantially circular plate, and has a diameter corresponding to that of the substrate 'W'. A notch 3244 is formed in an edge of the transferring plate 3240. The notch 3244 may have the shape corresponding to the protrusion 3429 formed on the hand 3420 of the transferring robot 3422. In addition, notches 3244 may be provided in number corresponding to the number of protrusions 3429 formed in the hand 3420 and may be formed at positions corresponding to the protrusions 3429. When the vertical positions of the hand 3420 and the transferring plate 3240 are changed in the state that the hand 3420 and the transferring plate 3240 are aligned in the vertical direction, the substrate 'W' is transferred between the hand 3420 and the transferring plate 3240. The transferring plate 3240 may be mounted on the guide rail 3249, and may move along the guide rail 3249 by a driver 3246. A plurality of guide grooves 3242 are provided in the shape of a slit in the transferring plate 3240. The guide groove 3242 extends from an end portion of the transferring plate 3240 to an inner part of the transferring plate 3240. The longitudinal direction of the guide groove 3242 is provided in the second direction 14, and the guide grooves 3242 are positioned to be spaced apart from each other in the first direction 12. The guide groove 3242 prevents the interference between the transferring plate 3240 and the lift pin 3238, when the substrate 'W' is transferred between the transferring plate 3240 and the heating unit 3230.

The heating of the substrate 'W' is achieved when the substrate 'W' is directly placed on the heating plate 3232, and the cooling of the substrate 'W' is achieved in the state that the transferring plate 3240 having the substrate 'W' makes contact with the cooling plate 3222. The transferring plate 3240 is formed of a material having a higher heat transfer coefficient such that heat is smoothly transferred between the cooling plate 3222 and the substrate 'W'. According to an embodiment, the transferring plate 3240 may be formed of a metal material.

Heating units 3230 provided in some of the heat treating chambers 3200 may improve the attachment rate of the photoresist to the substrate 'W' by feeding gas during the heating of the substrate 'W'. According to an example, the gas may include hexamethyldisilane gas.

A plurality of liquid treating chambers 3600 are provided. Some of the liquid treating chambers 3600 may be provided to be stacked on each other. The heat treating chambers 3600 are positioned at one side of the transferring chamber 3400. The liquid treating chambers 3600 are aligned in line with each other in the first direction 12. Some of the liquid treating chambers 3600 are provided in a position close to the index module 20. Hereinafter, these liquid treating chambers 3602 are referred to as front liquid treating chambers. Others of the liquid treating chambers 3600 are provided in a position close to the interface module 40. Hereinafter, these liquid treating chambers are referred to as rear liquid treating chambers 3604.

A first liquid is applied onto the substrate 'W' in the front liquid treating chamber 3602, and a second liquid is applied to the substrate 'W' in the rear liquid treating chamber 3604. The first liquid may be different from the second liquid. According to an embodiment, the first liquid is an anti-reflective liquid, and the second liquid is photoresist. The photoresist may be applied on the substrate 'W' having an anti-reflective film. Alternatively, the first liquid may be photoresist and the second liquid may be an anti-reflective liquid. In this case, the anti-reflective liquid may be coated onto the substrate 'W' coated with photoresist. Alternatively, the first liquid and the second liquid may be the same type of liquids, and all the first liquid and the second liquid may be photoresist.

Referring back to FIGS. 2 and 3, a plurality of buffer chambers 3800 are provided. Some of buffer chambers 3800 are interposed between the index module 20 and the transferring chamber 3400. Hereinafter, the buffer chamber is referred to as a front buffer 3802. A plurality of front buffers 3802 are provided and stacked on each other in the vertical direction. Others of the buffer chambers 3800 are interposed between the transferring chamber 3400 and the interface module 40. The buffer chambers are referred to as a rear buffer 3804. A plurality of front buffers 3804 are provided and stacked on each other in the vertical direction. The front buffers 3802 and the rear buffers 3804 temporarily store a plurality of substrates 'W'. The substrate 'W' stored in the front buffer 3802 is introduced and withdrawn by the index robot 2200, the transferring robot 3422, and a first robot 4602. The substrate 'W' stored in the rear buffer 3804 is introduced and withdrawn by the transferring robot 3422.

The developing block 30b has the heat treating chamber 3200, the transferring chamber 3400, and the liquid treating chamber 3600. The heat treating chamber 3200, and the transfer chamber 3400 in the developing block 30b have the structures and the arrangement substantially similar to those of the heat treating chamber 3200 and the transferring chamber 3400 in the coating block 30a, so the details thereof will be omitted.

All the liquid treating chambers 3600 in the developing block 30b supply the same developing liquid such that the substrate 'W' is subject to the developing treatment.

The interface module 40 connects the treating module 30 with an external exposing device 50. The interface module 40 has an interface frame 4100, an additional process chamber 4200, an interface buffer 4400, and a transferring member 4600.

A fan filter unit may be provided on the upper end of the interface frame 4100 to form a descending air stream in the interface frame 4100. The additional process chamber 4200, the interface buffer 4400, and the transferring member 4600 are provided inside the interface frame 4100. The substrate 'W' subject to the process in the coating block 30a may be subject to a specific additional process in the additional process chamber 4200 before introduced into the exposing device 50. Alternatively, the substrate 'W' subject to the process in the exposing device 50 may be subject to a predetermined additional process in the additional process chamber 4200 before introduced into the developing block 30b. According to an embodiment, the additional process may be an edge exposing process to expose an edge area of the substrate 'W', a top surface cleaning process to clean the top surface of the substrate 'W', or a bottom surface cleaning process to clean the bottom surface of the substrate 'W'. A plurality of additional process chambers 4200 may be provided and may be provided to be stacked on each other. All the additional process chambers 4200 may be provided to perform the same process. Alternatively, some of the additional process chambers 4200 may be provided to perform mutually different processes.

The interface buffer 4400 provides a space to temporarily stay the substrate 'W', which is transferred among the interface buffer 4400, the coating block 30a, the additional process chamber 4200, the exposing device 50, and the developing block 30b. A plurality of interface buffers 4400 are provided and may be provided to be stacked on each other.

According to an embodiment, when viewed based on a line extending in the lengthwise direction of the transferring chamber 3400, the additional process chamber 4200 may be disposed at one side, and the interface buffer 4400 may be disposed at an opposite side.

The transferring member 4600 transfers the substrate 'W' among the coating block 30a, the additional process chamber 4200, the exposing device 50, and the developing block 30b. The transferring member 4600 may be provided with one or a plurality of robots. According to an embodiment, the transferring member 4600 has the first robot 4602 and the second robot 4606. The first robot 4602 may be provided to transfer the substrate 'W' among the coating block 30a, the additional process chamber 4200, and the interface buffer 4400, and the second robot 4606 may be provided to transfer the substrate 'W' between the interface buffer 4400 and the exposing device 50, or between the interface buffer 4400 and the developing block 30b.

The first robot 4602 and the second robot 4606 may include hands in which the substrate 'W' is placed, and the hands may be provided to be movable forward and backward, rotatable about an axis parallel to the third direction 16, and movable in the third direction 16.

The hands of the index robot 2200, the first robot 4602, and the second robot 4606 may all have the same shape as the hand 3420 of the transferring robot 3422. Alternatively, the hand of the robot to directly transfer and receive the substrate 'W' together with the transferring plate 3240 of the heat treating chamber are provided in the same shapes as those of the hand 3420 of the transferring robot 3422, and the hand of the remaining robot may be provided in the shape different from the shapes.

According to an embodiment, the index robot 2200 may be provided to directly transmit and receive the substrate 'W' together with the heating unit 3230 of a front heat treating chamber 3200 provided in the coating block 30a.

In addition, the transferring robot 3342 provided in the coating block 30a and the developing block 30b may be provided to directly exchange the substrate 'W' with the transfer plate 3240 positioned in the heat treating chamber 3200.

The following description will be made in detail regarding the structure of the substrate treating apparatus to treat the substrate by supplying the treatment liquid onto the substrate rotating in process chambers according to the inventive concept. In The following description will be described regarding that the substrate treating apparatus is an apparatus to apply photoresist, by way of example. However, the substrate treating apparatus may be an apparatus to form a film, such as a protective film or an anti-reflective film, on the substrate 'W' rotating. Alternatively, the substrate treating apparatus may be an apparatus to supply a treatment liquid, such as a developing liquid, to the substrate 'W'.

Figure 7:
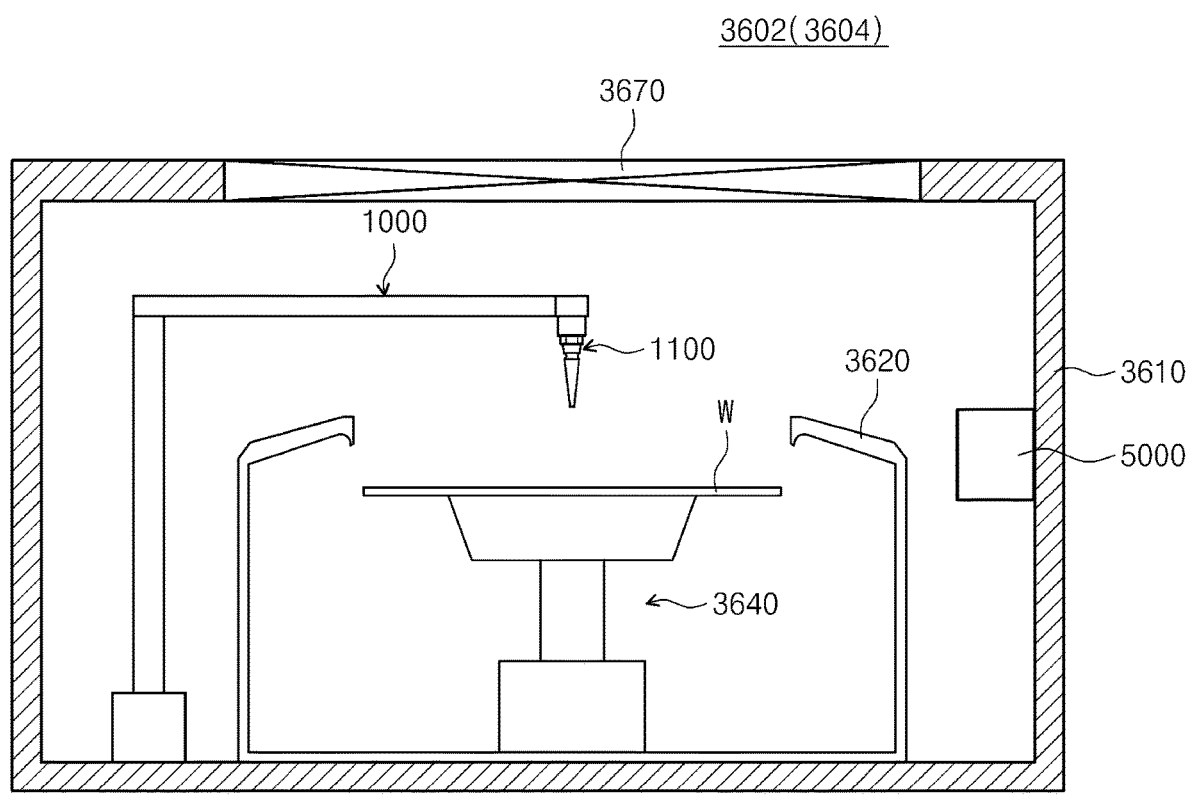
FIG. 7 is a view schematically illustrating a liquid treating chamber of FIG. 3.
Figure 8:
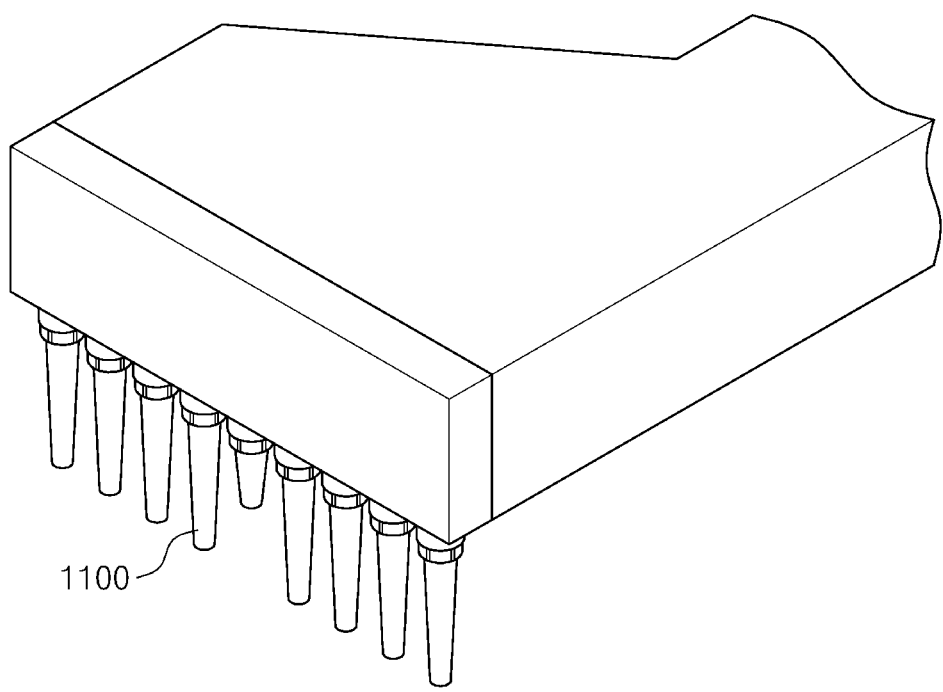
FIG. 8 is a perspective view illustrating nozzles of FIG. 7.
Figure 9:
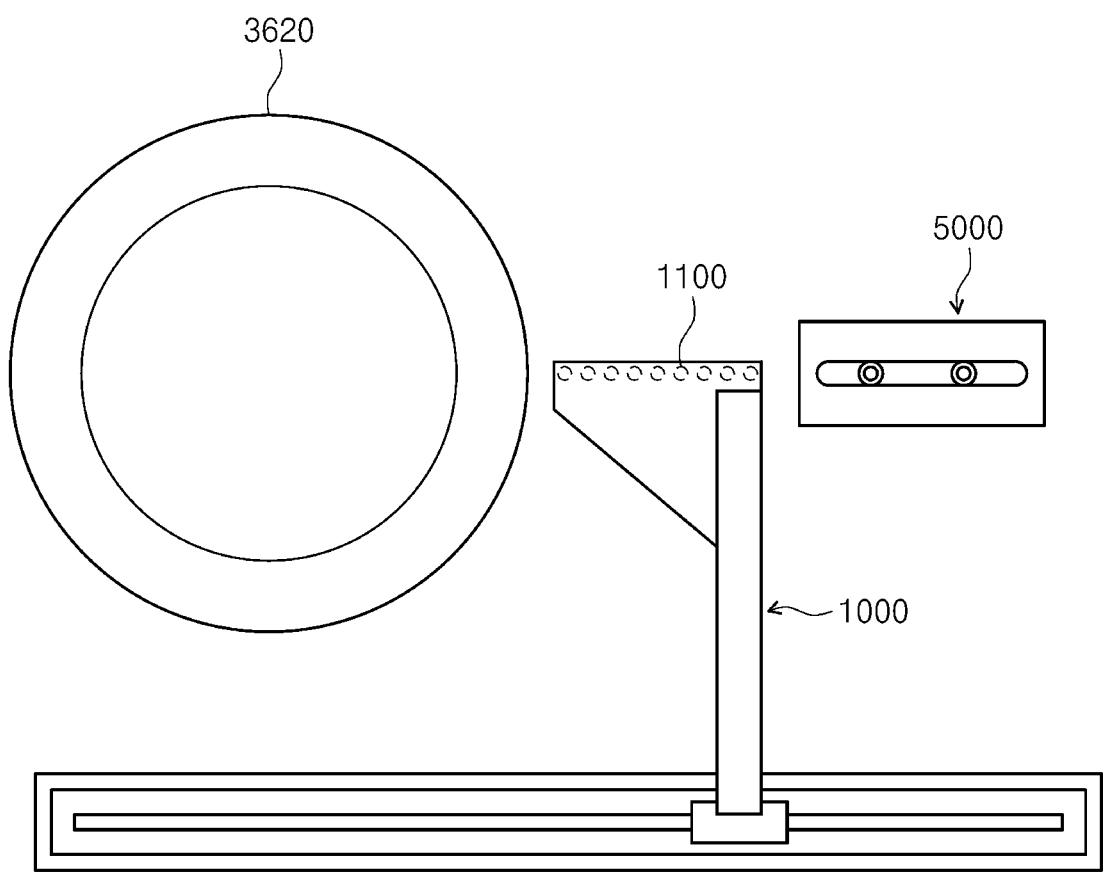
FIG. 9 is a plan view illustrating a liquid treating chamber of FIG. 7.

FIG. 7 is a view schematically illustrating the liquid treating chamber of FIG. 3. FIG. 8 is a perspective view illustrating nozzles of FIG. 7. FIG. 9 is a plan view illustrating the liquid treating chamber of FIG. 7.

Referring to FIG. 7, the liquid treating chamber 3600 has a housing 3610, a cup 3620, a substrate supporting unit 3640, a liquid supplying unit 1000, and a standby port 5000. The housing 3610 has a substantially rectangular parallelepiped shape. The housing 3610 is formed in a sidewall thereof with an entrance (not illustrated) to introduce or withdraw the substrate 'W'. The entrance may be open by a door (not illustrated). The cup 3620, the substrate supporting unit 3640, the liquid supplying unit 1000, and the standby port 5000 are provided in the housing 3610. A fan filter unit 3670 may be provided on a top wall of the housing 3610 to form a descending air flow inside the housing 3260. The cup 3620 has a treating space having an open upper portion. The substrate supporting unit 3640 is provided in the treating space to support the substrate 'W'. The substrate supporting unit 3640 is provided such that the substrate 'W' is rotatable during the liquid treatment. The liquid supplying unit 1000 supplies liquid to the substrate 'W' supported by the substrate supporting unit 3640.

The liquid supplying unit 1000 includes a plurality of nozzles 1100. Each of a plurality of nozzles 1100 supplies a different type of treatment liquids. Mutually independent liquid supplying pipes are connected to the nozzles 1100. The nozzles 1100 move between a standby position and a process position to supply the treatment liquid. The process position is a position at which the nozzles 1100 may discharge the treatment liquid to the center of the substrate 'W', and the standby position is a position at which the nozzles 1100 stand by in the standby port 5000. For example, the treatment liquid may be a photosensitive liquid such as a photoresist.

The standby port 5000 provides a space for the nozzles 1100 to stand by at one side of a treating container. The nozzles 1100 stand by at the standby port 5000, before and after performing the liquid treatment process. The standby port 5000 cleans the nozzles 1100 and prevents the treatment liquid remaining in a discharge end of the nozzles 1100 from being hardened, while the nozzles 1100 are standing by.

Figure 10:
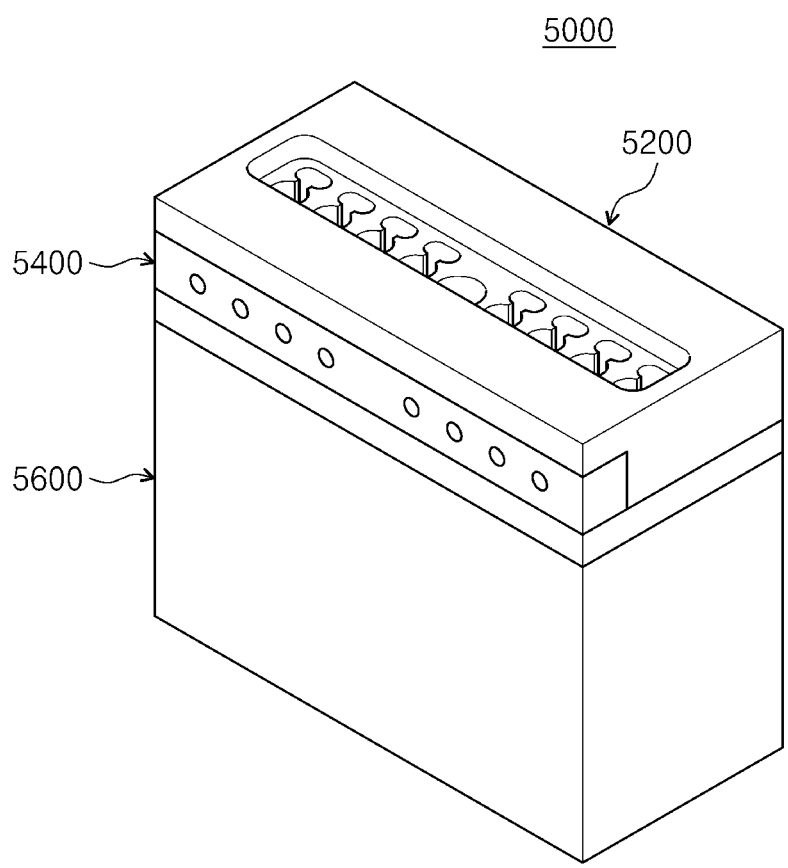
FIG. 10 is a perspective view of a standby port, according to the inventive concept.
Figure 11:
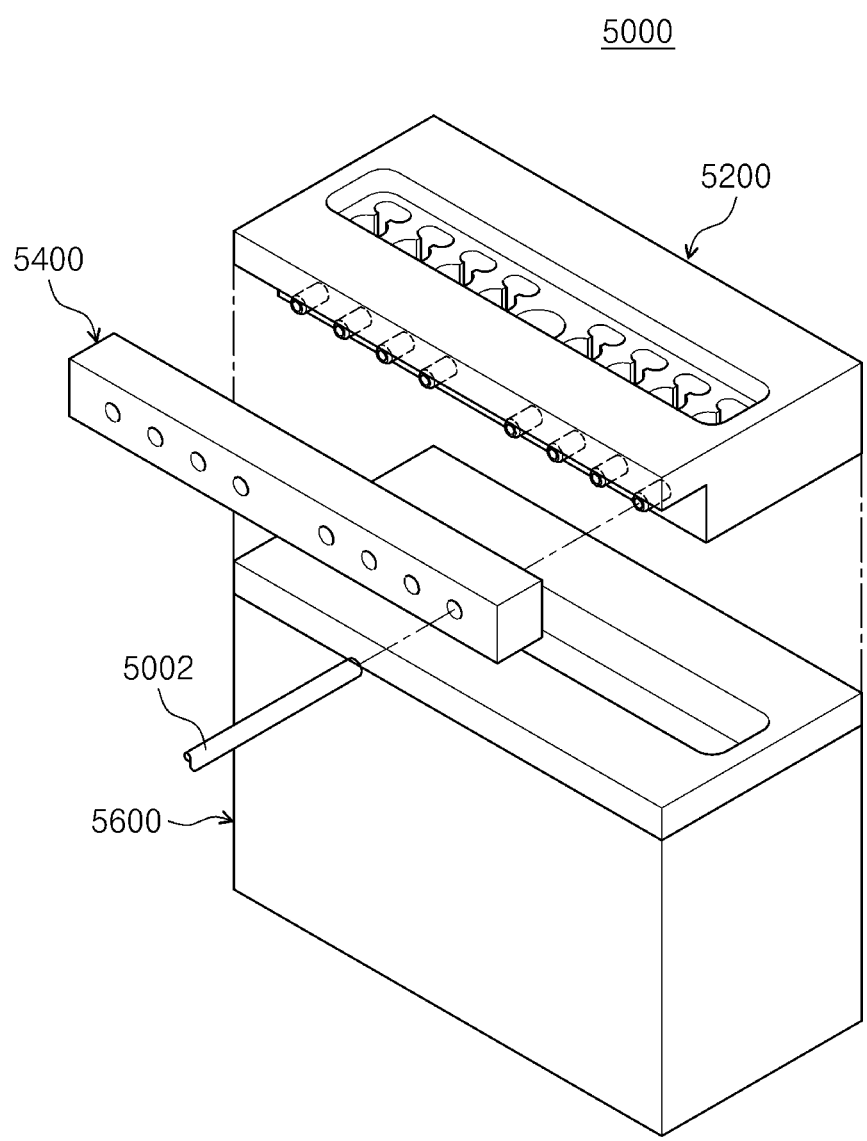
FIG. 11 is an exploded perspective view of a standby port, according to an embodiment of the inventive concept.
Figure 12:
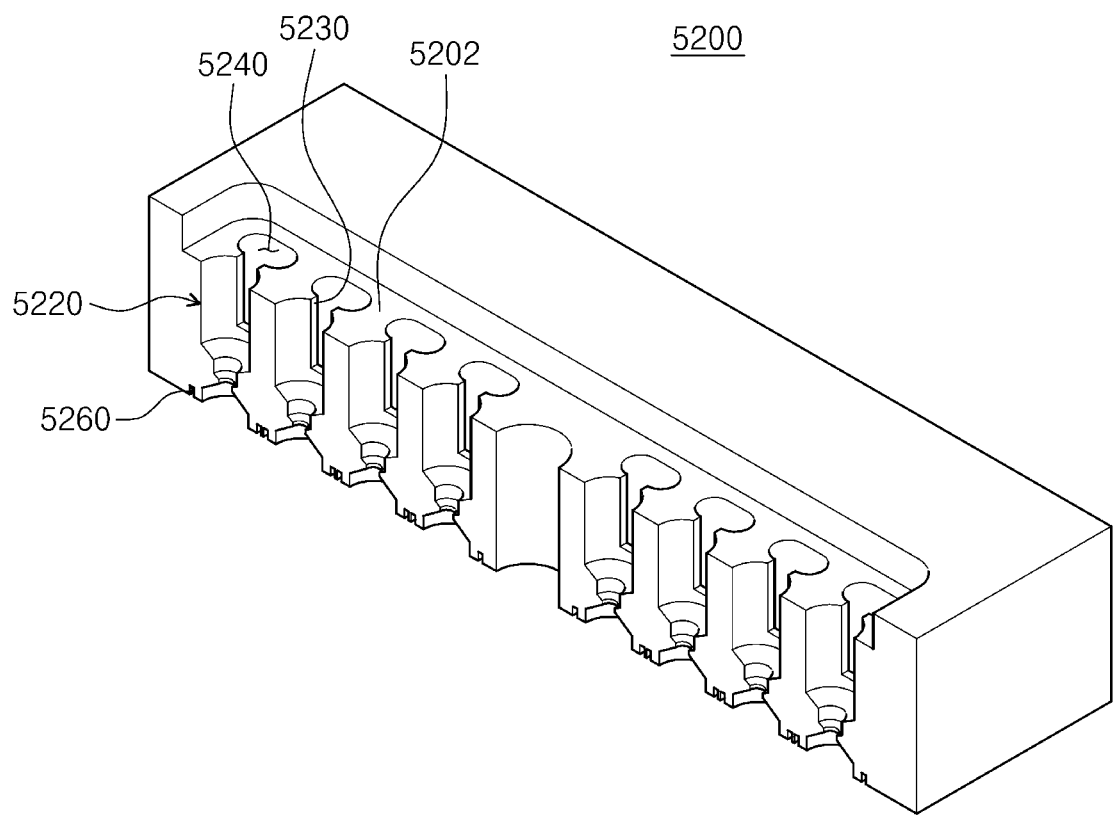
FIG. 12 is a cross-sectional view of the nozzle receiving member of FIG. 10, when viewed from one side.
Figure 13:
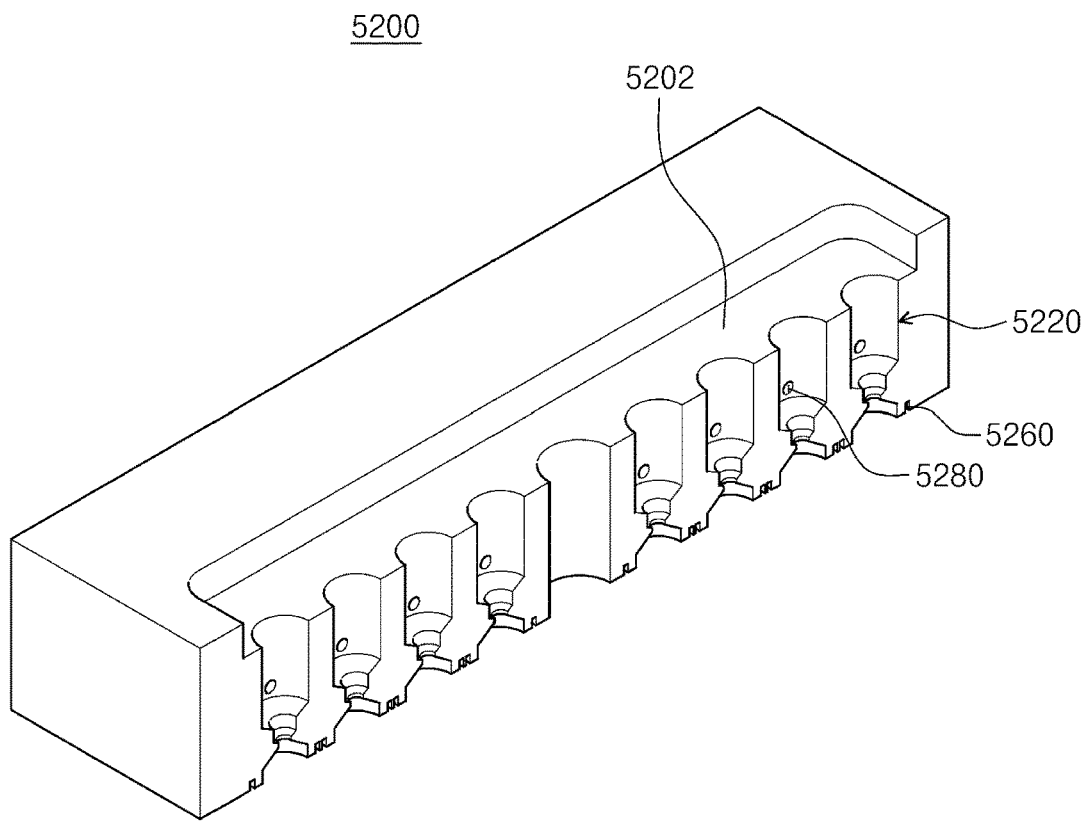
FIG. 13 is a cross-sectional view of the nozzle receiving member of FIG. 10, when viewed from an opposite side.
Figure 14:
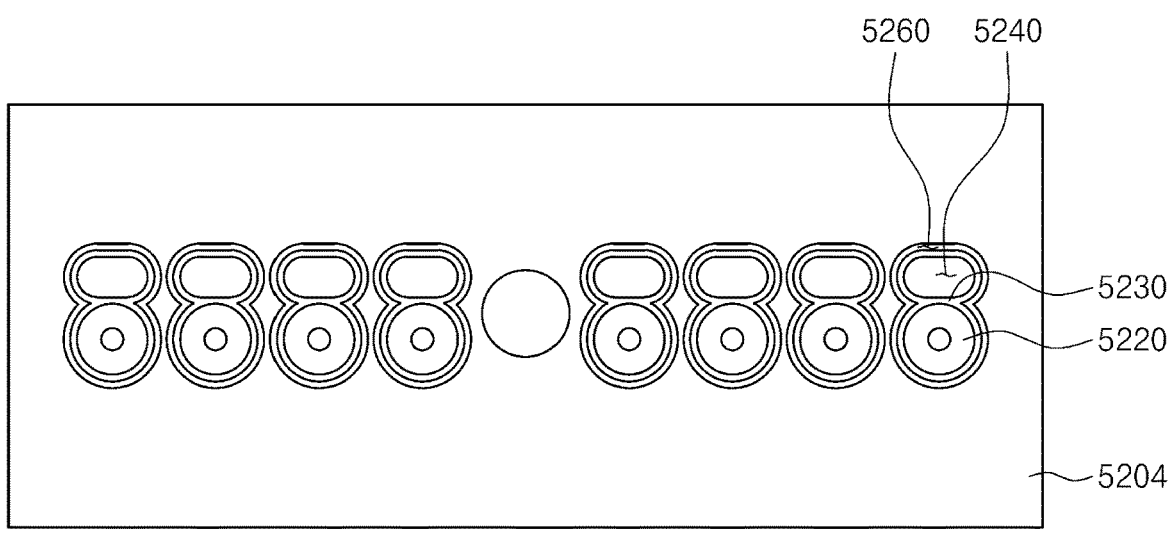
FIG. 14 is a bottom view of the nozzle receiving member of FIG. 10, when viewed from the bottom.
Figure 15:
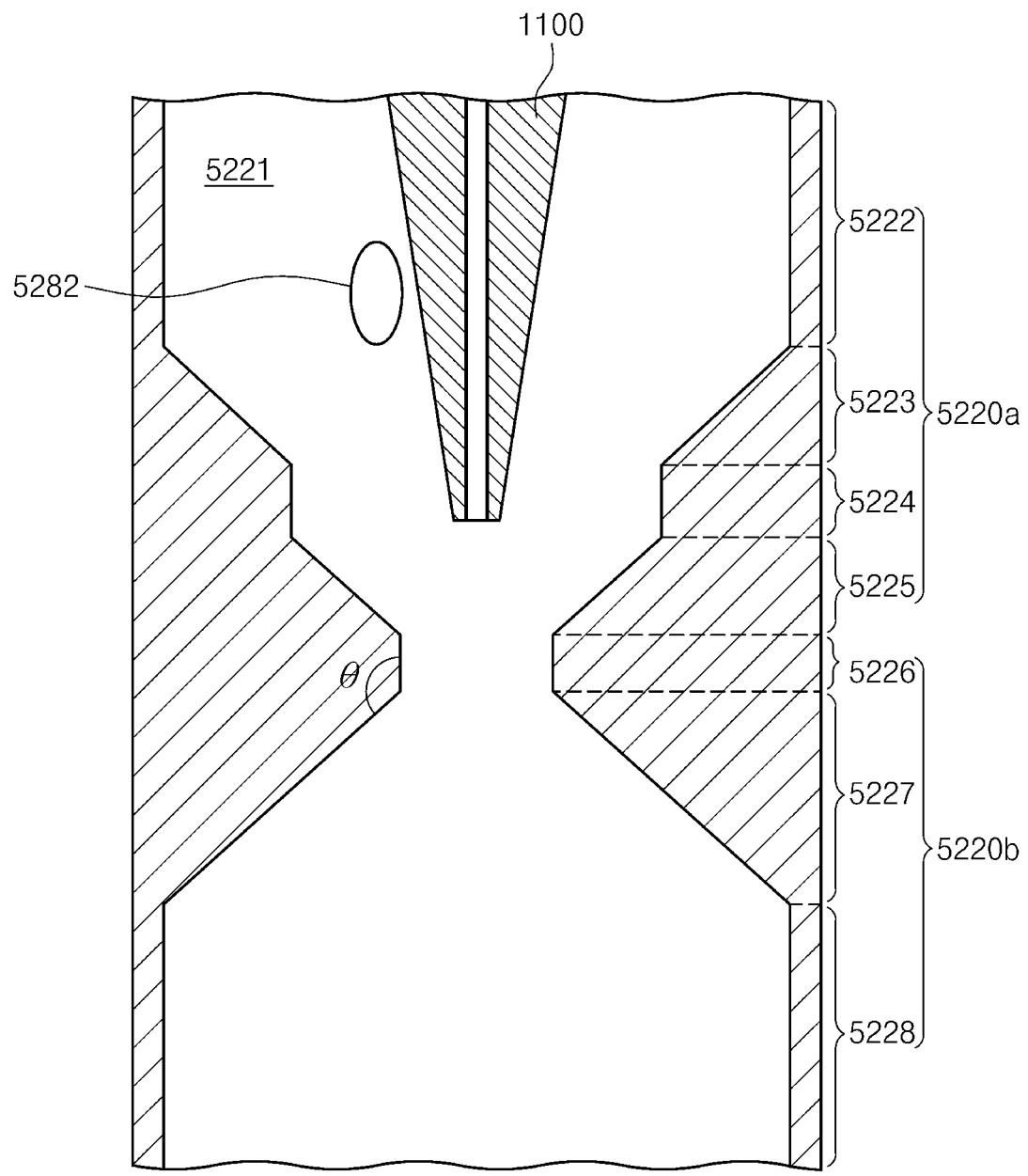
FIG. 15 is a cross-sectional view illustrating a nozzle cleaning unit of a nozzle receiving member of FIG. 10.

FIG. 10 is a perspective view of a standby port according to an embodiment of the inventive concept, FIG. 11 is an exploded perspective view of a standby port according to an embodiment of the inventive concept, FIG. 12 is a cross-sectional view when the nozzle receiving member of FIG. 10 is viewed from one side, FIG. 13 is a cross-sectional view illustrating the nozzle receiving member of FIG. 10 when viewed from an opposite side, FIG. 14 is a bottom view illustrating the nozzle receiving member of FIG. 10 when viewed from the bottom, and FIG. 15 is a sectional view illustrating a nozzle cleaning unit of the nozzle receiving member of FIG. 10.

Referring to FIGS. 7 and 9, the standby port 5000 is disposed in the housing 3610. The standby port 5000 is disposed outside the cup 3620 in the housing 3610. The standby port 5000 is provided at a position corresponding to the standby positions of the nozzles 1100. The standby port 5000 may be positioned on a movement path through which the nozzles 1100 move between the process position and the standby position.

Referring to FIGS. 10 and 11, the standby port 5000 includes a nozzle receiving member 5200 and a pipe fixing member 5400. In addition, the standby port 5000 may further include a drain member 5600. The nozzle receiving member 5200 receives the nozzles 1100 standing by. The nozzle receiving member 5200 cleans the nozzles 1100 which are standing by and prevents the treatment liquid remaining in a discharge end of the nozzles 1100 from being cured.

Referring to FIGS. 12 and 13, the nozzle receiving member 5200 includes a nozzle receiving unit 5220, an anti-overflow hole 5240, and an anti-movement groove (structure) 5260.

The nozzle receiving unit 5220 is provided to receive the nozzle 1100.

A plurality of nozzle receiving units 5220 are provided. For example, the nozzle receiving units 5220 may be provided in number corresponding to one-to-one to the number of nozzles 1100. The nozzle receiving units 5220 are positioned independently from each other. Accordingly, particles produced from any one nozzle 1100 may be prevented from being influenced on another nozzle 1100 or the whole nozzles 1100. When viewed from above, the nozzle receiving units 5220 may be positioned to be aligned in line with each other in one direction. For example, the plurality of nozzle receiving units 5220 may be aligned in line with each other along a longer side of the nozzle cleaning member 5200.

Referring to FIG. 15, a receiving space 5221 to receive the nozzle 1100 or a cleaning liquid is formed inside the nozzle receiving unit 5220. The nozzle receiving unit 5220 has the shape of a cylinder facing the vertical direction. The nozzle receiving unit 5220 has the shape in which the width of the nozzle receiving unit 5220 is narrowed and widened again downward. The nozzle receiving unit 5220 has a nozzle cleaning unit 5220a and a discharge unit 5220b. The nozzle cleaning unit 5220a receives the nozzle 1100. The nozzle cleaning unit 5220a provides a space for cleaning the received nozzle 1100. A tip of the nozzle 110 is dipped into the cleaning liquid 'L' to be cleaned, in the state in which the cleaning liquid 'L' is filled at a specific water level in the receiving space of the nozzle cleaning unit 5220a, or the state in which a tip of the nozzle 1100 is moved down into the receiving space (5224) and the cleaning liquid is filled at the specific water level.

A plurality of nozzle cleaning units 5220a are provided in the plurality of nozzle receiving units 5220, respectively. The plurality of nozzle cleaning units 5220a are provided in number corresponding one-to-one to the plurality of nozzles 1100. The cleaning liquid 'L' is filled in the nozzle cleaning unit 5220a corresponding to the nozzle 1100 to be cleaned, and a nozzle cleaning process is individually and selectively performed with respect to an individual nozzle 1100.

The nozzle cleaning unit 5220a includes an upper body part 5222, a first inclined part 5223, a discharge end receiving part 5224, and a second inclined part 5225. The upper body part 5222, the first inclined part 5223, the discharge end receiving part 5224, and the second inclined part 5225 are provided to extend sequentially downward. The upper body part 5222 is provided as an upper region of the nozzle cleaning unit 5220a. The upper body part 5222 is provided to have a uniform width in the vertical direction. The upper body part 5222 and a lower body part 5228 to be described are provided to have a width greater than that of another part.

A discharge port 5282 is formed in an inner surface of the upper body part 5222. The discharge port 5282 serves as a hole to discharge the cleaning liquid 'L' to the upper body part 5222. A cleaning liquid supplying pipe 5002 is connected to the discharge port 5282, and the cleaning liquid supplying pipe 5002 supplies the cleaning liquid from a storage tank (not illustrated) to the discharge port 5282. For example, the cleaning liquid may be provided as a liquid for removing the treatment liquid and a foreign substance attached to the discharge end of the nozzle 1100 and a peripheral portion. The cleaning liquid may be a liquid including air bubbles. The cleaning liquid may include a thinner. The discharge port 5282 is positioned to overlap the nozzle tip 1100 when viewed from above.

The first inclined part 5223 has the shape of a cylinder extending downward from a lower end of the upper body part 5222. The first inclined part 5223 is provided to have a width gradually reduced downward. The first inclined part 5223 primarily guides the liquid remaining in the receiving space 5221 to flow downward.

The discharge end receiving part 5224 has the shape of a cylinder extending downward from a lower end of the first inclined part 5223. The discharge end receiving part 5224 is provided to have a uniform width in the vertical direction. The discharge end receiving part 5224, which is a space for positioning the discharge end of the nozzle 1100, is provided to have width greater than that of the nozzle 1100.

The second inclined part 5225 extends downward from the lower end of the discharge end receiving part 5224. The second inclined part 5225 is provided to have the shape of a cylinder having a width gradually narrowed downward. The first inclined part 5223 and the second inclined part 5225 may be provided to have a tilt angle ranging from 30 degrees to 60 degrees from the ground, respectively.

The discharge unit 5220b is disposed under the nozzle cleaning unit 5220a. The discharge unit 5220b communicates with the nozzle cleaning unit 5220a. The discharge unit 5220b discharges the cleaning liquid after cleaning the nozzle in the nozzle cleaning unit 5220a, downward. The discharge unit 5220b includes a first port 5226 and a second port 5227. The discharge unit 5220b may further include the lower body part 5228. The first port 5226, the second port 5227, and the lower body part 5228 extend sequentially downward.

The first port 5226 has the shape of a cylinder extending downward from a lower end of the second inclined part 5225. The first port 5226 is provided to have a smaller width than that of another part. For example, the width of the first port 5226 may be provided to be greater than the inner diameter of the discharge end of the nozzle 1100. In addition, the first port 5226 is provided to have a length shorter than that of another part in the vertical length. For example, the length of the first port 5226 in the vertical direction may be provided to be less than the inner diameter of the discharge end of the nozzle 1100. The length of the first port 5226 may prevent air bubbles passing through the first port 5226 from flowing back and flowing up.

The second port 5227 has the shape of a cylinder extending downward from a lower end of the first port 5226. The second port 5227 has the shape of a cylinder having a width widened downward. The second port 5227 is formed to be inclined with respect to the extending direction of the first port 5226. In this case, the angle $\Theta$ between the first port 5226 and the second port 5227 may have a range greater than 90° and less than 180°. Accordingly, the air bubbles passing through the first port 5226 burst or are made be larger, to be prevented from flowing back.

The lower body part 5228 has the shape of a cylinder extending downward from a lower end of the second port 5227. The lower body part 5228 is provided to have a uniform width in the vertical direction. For example, the lower body part 5228 may have the same width as that of the upper body part 5222. A discharge line (not illustrated) is connected to the lower body part 5228. The discharge line discharges the cleaning liquid transferred to the lower body part 5228 to the outside. A valve is mounted on the discharge line to open or close the discharge line.

A controller (not illustrated) controls the valve mounted on the discharge line. The controller controls the valve to close the discharge line in the middle of discharging the cleaning liquid 'L' such that the cleaning liquid 'L' is filled in the receiving space 5221. Accordingly, the discharge end of the nozzle 1100 is dipped into the cleaning liquid 'L' filled in the receiving space 5221 such that the discharge end is cleaned.

Referring to FIGS. 12 to 14, the nozzle receiving member 5200 includes the anti-overflow hole 5240. The anti-overflow hole 5240 is formed, as a top surface 5202 of the nozzle receiving member 5200 is recessed. The sectional area of the anti-overflow hole 5240 is smaller than or similar to that of the nozzle receiving unit 5220. The anti-overflow hole 5240 communicates with the nozzle cleaning unit 5220a. A plurality of anti-overflow holes 5240 are provided. The plurality of anti-overflow holes 5240 are provided in number corresponding one-to-one to the number of the plurality of nozzle receiving units 5220a. The anti-overflow holes 5240 communicate with the plurality of nozzle cleaning units 5220a in a direction perpendicular to the arrangement direction of a plurality of nozzle cleaning units 5220a. The anti-overflow hole 5240 prevents the cleaning liquid and photoresist, which are filled in the receiving space 5221, from overflowing out of the top of the receiving space 5221. In addition, the anti-overflow hole 5240 adjusts the water level of the cleaning liquid 'L' filled in the nozzle cleaning unit 5220a. Accordingly, the anti-overflow hole 5240 is formed to have a length corresponding to the longitudinal direction of the nozzle cleaning unit 5220a. The anti-overflow holes 5240 is provided at an opposite side of the discharge port 5282.

Referring to FIG. 12, a stepped part 5230 is interposed between the anti-overflow hole 5240 and the nozzle receiving unit 5220. The stepped part 5230 forms a passage for allowing the anti-overflow hole 5240 and the nozzle receiving unit 5220 to communicate with each other. The stepped part 5230 forms a communication path between the upper body part 5222 of the nozzle receiving unit 5220 and the anti-overflow hole 5240. When viewed from above, the stepped part 5230 is provided to protrude inward from the upper body part 5222 and the anti-overflow hole 5240. The stepped part 5230 is provided to protrude upward from a portion in which the upper body part 5222 and the first inclined part 5223 are connected to each other. Accordingly, the cleaning liquid 'L' discharged from the discharge port 5282 may be induced to be first filled in the nozzle cleaning unit 5220a.

The anti-movement groove (structure) 5260 is recessed upward from a bottom surface 5204 of the nozzle receiving member 5200. The anti-movement groove (structure) 5260 is formed to extend along an outer circumference of the nozzle receiving unit 5220 and the anti-overflow hole 5240. In more detail, the anti-movement groove (structure) 5260 extends along the circumference of the lower body part 5228 of the discharge unit 5220b and the anti-overflow hole 5240. The anti-movement groove (structure) 5260 prevents the cleaning liquid from moving left or right, when the cleaning liquid 'L' is drained, thereby preventing the drain rate from being lagged.

Figure 16:
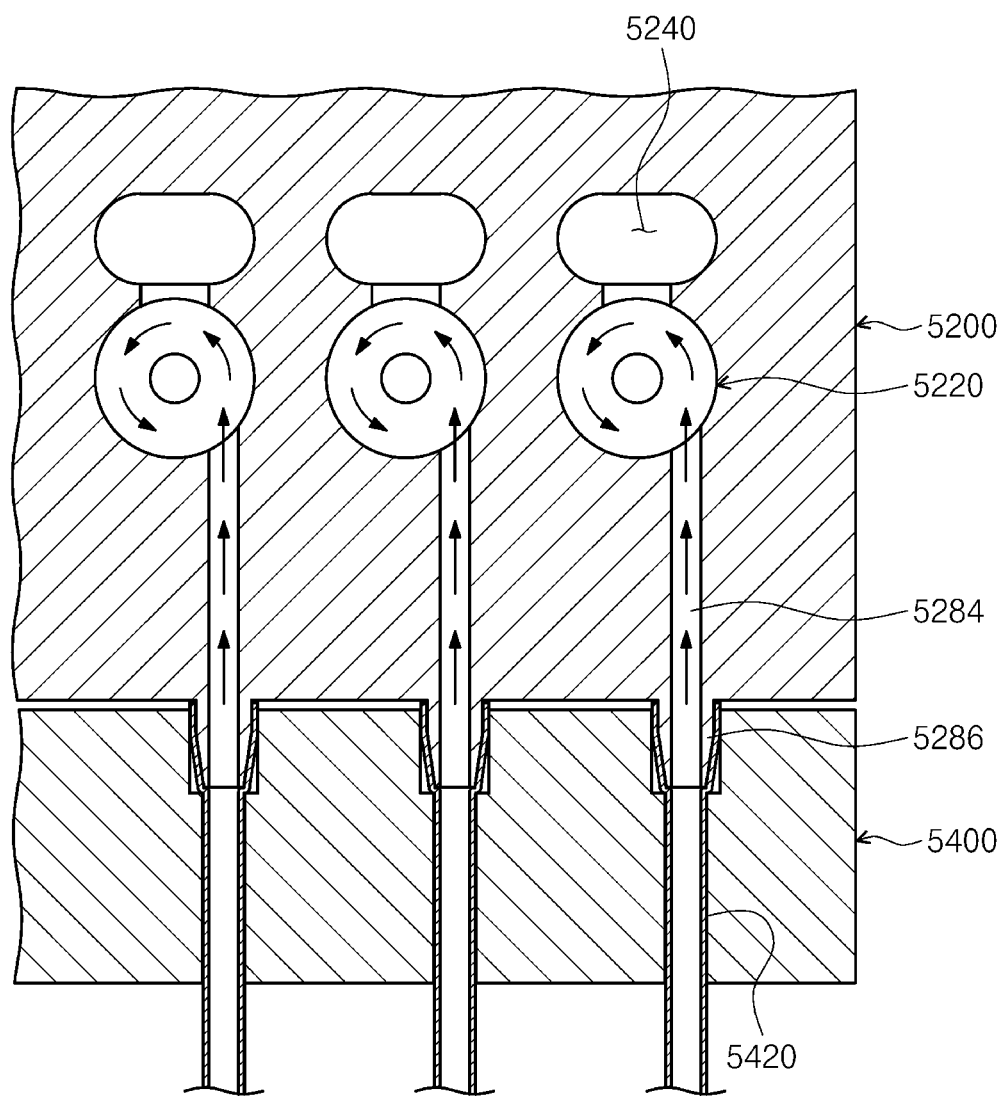
FIG. 16 is a view illustrating that the nozzle receiving member and the pipe fixing member of FIG. 10 are coupled to each other.
Figure 17:
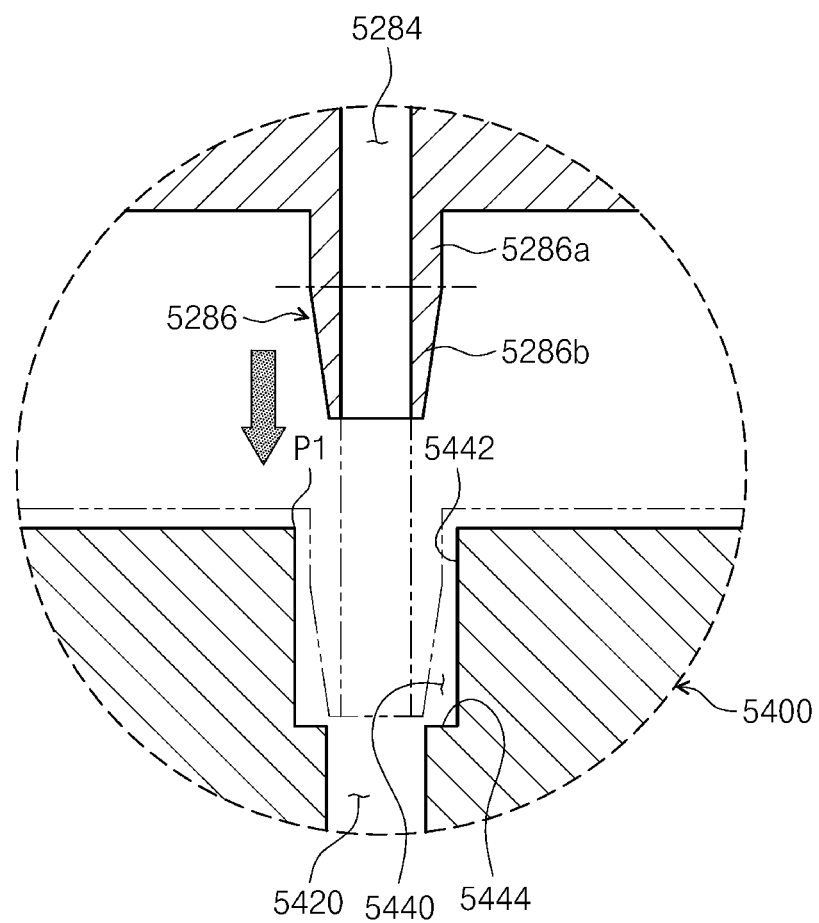
FIG. 17 is a view schematically illustrating the procedure in which the nozzle receiving member and the pipe fixing member of FIG. 16 are coupled to each other.

FIG. 16 is a view illustrating that the nozzle receiving member and the pipe fixing member of FIG. 10 are coupled to each other. FIG. 17 is a view schematically illustrating the procedure in which the nozzle receiving member and the pipe fixing member of FIG. 16 are coupled to each other.

Referring to FIG. 16, the nozzle receiving member 5200 includes a discharge part 5280. The discharge part 5280 is provided in the side surface of the nozzle receiving member 5200. The discharge part 5280 protrudes from the side surface of the nozzle receiving member 5200. A cleaning liquid supplying pipe 5002 is coupled to the discharge part 5280. The cleaning liquid flowing through the cleaning liquid supplying pipe 5002 is discharged to the receiving space 5221 through the discharge part 5280.

The discharge part 5280 includes a coupling part 5286 into which the cleaning liquid supplying pipe 5002 is inserted, and coupled to the pipe fixing member 5400. The coupling part 5286 protrudes from the side surface of the nozzle receiving member 5200. The coupling part 5286 includes a first part 5286a having a first width, and a second part 5286b extending from the first part 5286a and having a width less than the first width. The width of the second part 5286b of the coupling part 5286 is reduced in a direction away from the first part. A discharge fluid passage 5284 through which the cleaning liquid discharged from the cleaning liquid supplying pipe 5002 flows is formed inside the coupling part 5286. The discharge port 5282 is positioned in the end of the discharge fluid passage 5284. The discharge port 5282 is provided in the side surface of the nozzle cleaning unit 5220a. The discharge port 5282 is provided in the inner surface of the upper body part 5222. The width of the discharge port 5282 is provided to overlap a portion of the end of the nozzle 1100 received in the nozzle receiving unit 5220. Accordingly, the cleaning liquid 'L' discharged from the discharge port 5282 rotates along the outer circumferential surface of the nozzle 1100 to move to a surface, which is opposite to the discharge direction of the cleaning liquid 'L' of the outer circumferential surface of the nozzle 1100. In this case, the entire surface of the nozzle 1100 may be uniformly cleaned.

Referring to FIGS. 16 and 17, the pipe fixing member 5400 is coupled to the nozzle receiving member 5200. The pipe fixing member 5400 is coupled to one side of the nozzle receiving member 5200. The pipe fixing member 5400 fixes the cleaning liquid supplying pipe 5002 to supply the cleaning liquid 'L' to the nozzle receiving member 5200. The pipe fixing member 5400 includes a pipe insertion hole 5420 and an anti-leakage groove (structure) 5440.

The pipe insertion hole 5420 is formed through two side surfaces of the pipe fixing member 5400. The cleaning liquid supplying pipe 5002 is inserted into the pipe insertion hole 5420. The diameter of the pipe insertion hole 5420 is equal to or slightly larger than the outer diameter of the cleaning liquid supplying pipe 5002. The diameter of the pipe insertion hole 5420 is provided to be less than the diameter of the end of the second part 5286b of the coupling part 5286. The diameter of the pipe insertion hole 5420 is provided to be less than the minimum width of the second part 5286b of the coupling part 5286. Accordingly, when the nozzle receiving member 5200 and the pipe fixing member 5400 are completely coupled to each other, the end of the coupling part 5286 is pressed into the pipe insertion hole 5420 to prevent the cleaning liquid 'L' from leaking.

The anti-leakage groove (structure) 5440 is formed in the inner surface of the pipe insertion hole 5420. The anti-leakage groove (structure) 5440 is formed in a part, to which the coupling part 5286 is coupled, of the inner surface of the pipe insertion hole 5420. The anti-leakage groove (structure) 5440 is provided to have a diameter greater than a diameter of the pipe insertion hole 5420. The anti-leakage groove (structure) 5440 may be provided to have a diameter equal to or slightly greater than the diameter of the first part 5286a of the coupling part 5286. The anti-leakage groove (structure) 5440 may be provided to have a diameter greater than the maximum diameter of the second part 5286b of the coupling part 5286. The anti-leakage groove (structure) 5440 includes a first surface 5442 positioned outside the inner surface of the pipe insertion hole 5420 and a second surface 5444 to link the inner surface of the pipe insertion hole 5420 to the first surface 5442. The first surface 5442 is provided to be parallel to the inner surface of the pipe insertion hole 5420, and the second surface 5444 is provided to be perpendicular to the inner surface of the pipe insertion hole 5420. When the nozzle receiving member 5200 and the pipe fixing member 5400 are coupled to each other, a point P1, at which the inner surface of the pipe insertion hole 5420 and the second surface 5444 are linked to each other, makes contact with the coupling part 5286 and is pressurized, thereby preventing the cleaning liquid 'L' from leaking. When the nozzle receiving member 5200 and the pipe fixing member 5400 are coupled to each other, the point P1, at which the inner surface of the pipe insertion hole 5420 and the second surface 5444 are linked to each other, makes contact with the cleaning liquid supplying pipe 5002, thereby preventing the cleaning liquid 'L' from leaking.

Figure 18:
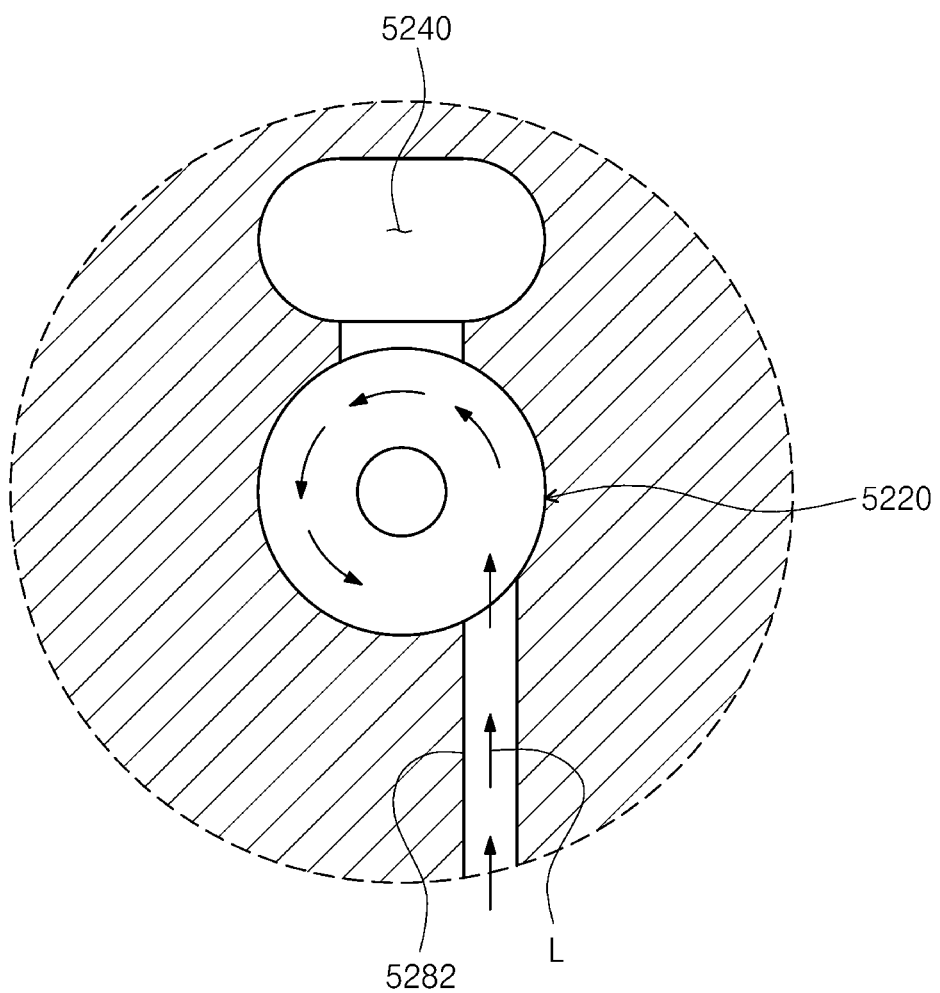
FIG. 18 is a view schematically illustrating a process of cleaning a nozzle in a standby port according to an embodiment of the inventive concept.

FIG. 18 is a view schematically illustrating a process of cleaning a nozzle in a standby port according to an embodiment of the inventive concept.

Referring to FIG. 18, the discharge port 5282 is positioned eccentrically from the center of the nozzle 1100. When viewed from above, the discharge port 5282 is provided to partially overlap the nozzle 1100. In this case, the cleaning liquid discharged from the discharge port 5282 may flow along the outer circumferential surface of the facing nozzle 1100 to clean the entire surface of the nozzle 1100.

Hereinafter, a method for treating the substrate by using the above-described substrate treating apparatus 1 will be described.

Hereinafter, a method for treating the substrate by using the above-described substrate treating apparatus 1 will be described. The method for treating the substrate includes treating a liquid and cleaning the nozzle 1100. In the treating of the liquid, the nozzle 1100 is positioned to the process position to supply the treatment liquid onto the substrate. When the treatment liquid is completely supplied, the nozzle 1100 stops supplying the treatment liquid and the cleaning of the nozzle 110 is performed.

The cleaning of the nozzle 1100 includes forming a first gas layer, cleaning the discharge end of the nozzle, forming a liquid layer, and forming a second gas layer. In the forming of the first gas layer, before moving the nozzle 1100 from the process position to the standby position, the treatment liquid, which is positioned at the discharge end of the nozzle 110, is sucked back to be moved in a direction opposite to the discharge direction of the treatment liquid. When an end of the treatment liquid is positioned to be higher than the discharge end of the nozzle 1100, the nozzle 1100 is moved to the standby position.

In the step of cleaning the discharge end, the discharge end of the nozzle 1100 is positioned to be inserted into the receiving space 52221 such that the discharge end of the nozzle 1100 is dipped into the cleaning liquid 'L' filled in the receiving space 5221. In this case, the discharge line is maintained to be closed to prevent the water level of the cleaning liquid 'L' from being changed. The discharge end of the nozzle 1100 is cleaned by the cleaning liquid 'L'. Since the first gas layer is formed between the discharge end of the nozzle 1100 and the end of the treatment liquid, the cleaning liquid 'L' is prevented from being introduced into the nozzle 1100. When the discharge end of the nozzle 1100 and the peripheral portion of the nozzle 1100 are completely cleaned, the forming of the liquid layer is performed.

In the forming of the liquid layer, the cleaning liquid 'L' received in the receiving space 5221 is suctioned. Accordingly, the treatment liquid and the first gas layer provided in the nozzle 1100 are sucked back together, and the liquid layer is formed by the cleaning liquid 'L' at a position spaced apart from the treatment liquid. The liquid layer made by the cleaning liquid 'L' may be partially volatilized to prevent the end of the treatment liquid from being cured.

When the forming of the liquid layer is completed, the discharge line is open to discharge the cleaning liquid 'L' filled in the receiving space 5221. When the cleaning liquid 'L' is discharged, an inner part of the nozzle 1100 is suctioned to form the second gas layer. The second gas layer is formed between the discharge end of the nozzle 1100 and the liquid layer. Accordingly, the treatment liquid, the first gas layer, the liquid layer, and the second gas layer may be sequentially formed downward inside the nozzle 1100.

According to the inventive concept, the plurality of nozzles may be individually and selectively cleaned.

In addition, according to an embodiment of the inventive concept, the entire surface of the nozzle may be cleaned.

In addition, according to an embodiment of the inventive concept, the nozzle may be prevented from being contaminated while the nozzle is standing by.

In addition, according to an embodiment of the inventive concept, the cleaning liquid for the nozzle may be prevented from leaking from the supplying pipe to supply the cleaning liquid to the standby port.

In addition, according to an embodiment of the inventive concept, the water level of the cleaning liquid received in the standby port may be adjusted, and the cleaning liquid may be prevented from overflowing out of the standby port.

In addition, according to an embodiment of the inventive concept, when the cleaning liquid is discharged after the cleaning process is performed, the discharge rate may be prevented from lagged.

In addition, according to an embodiment of the inventive concept, the photoresist in the nozzle pipe may be prevented from being cured.

The effects produced in the inventive concept are not limited to the aforementioned effects, and any other effects not mentioned herein will be clearly understood from the detailed description and accompanying drawings by those skilled in the art to which the inventive concept pertains.

The above description has been made for the illustrative purpose. Furthermore, the above-mentioned contents describe an embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. The written embodiment describes the best state for implementing the technical spirit of the inventive concept, and various changes required in the detailed application fields and purposes of the inventive concept can be made. Furthermore, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate treating apparatus comprising:
   a treating container having a treatment space to treat a substrate;
   a standby port positioned at one side of the treating container to allow a nozzle, which discharges a treatment liquid, to stand by; and
   a liquid supplying unit having the nozzle and moving between the treating container and the standby port,
   wherein the standby port includes:
      a nozzle receiving member including a nozzle cleaning unit having a receiving space formed inside the nozzle cleaning unit to receive the nozzle, and a cleaning liquid; and
      a discharge part having a discharge port provided at one side of the nozzle cleaning unit to discharge the cleaning liquid to the nozzle,
   wherein the discharge port is provided to overlap at least a portion of the nozzle when viewed from above,
   wherein the nozzle receiving member includes an anti-movement groove extending in a bottom surface of the nozzle receiving member, and
   wherein the anti-movement groove extends along a circumference of the nozzle cleaning unit to prevent the cleaning liquid from moving left or right when the cleaning liquid is drained.

2. The substrate treating apparatus of claim 1, wherein the cleaning liquid supplied from the discharge port rotates along an outer surface of the nozzle and a wall of a nozzle receiving unit.

3. The substrate treating apparatus of claim 2, wherein the cleaning liquid discharged from the discharge port rotates to a surface, which is positioned at an opposite side in a discharge direction of the cleaning liquid, of the outer surface of the nozzle.

4. The substrate treating apparatus of claim 1, wherein a plurality of nozzle cleaning units, each including the nozzle cleaning unit, are provided, positioned to be mutually independent from each other, and arranged in one direction when viewed from above.

5. The substrate treating apparatus of claim 4, wherein the standby port includes a plurality of anti-overflow holes provided to communicate with a plurality of nozzles cleaning units in a direction perpendicular to an arrangement direction of the plurality of nozzle cleaning units.

6. The substrate treating apparatus of claim 1, wherein the standby port includes:
   a pipe fixing member coupled to the nozzle receiving member to fix a cleaning liquid supplying pipe to supply the cleaning liquid to the discharge port,
   wherein the pipe fixing member includes a pipe insertion hole into which the cleaning liquid supplying pipe is inserted, and an anti-leakage groove (structure) formed in the pipe insertion hole.

7. The substrate treating apparatus of claim 6, wherein a discharge part of the nozzle receiving member includes:

a coupling part protruding from a side surface of the nozzle receiving member, in which the cleaning liquid supplying pipe is coupled to the coupling part,
wherein the coupling part includes:
a first part having a first width and a second part extending from the first part and having a width smaller than the first width, and
wherein a diameter of the pipe insertion hole is provided to be less than a width of an end of the second part of the coupling part.

8. The substrate treating apparatus of claim 5,
wherein the anti-movement groove extends along a circumference of the anti-overflow holes.

9. The substrate treating apparatus of claim 1, wherein the nozzle receiving member includes:
a discharge unit positioned under the nozzle cleaning unit, wherein the discharge unit includes:
a first port extending downward from a lower end of the nozzle cleaning unit; and
a second port extending downward from the first port and having a width increased in a direction away from the first port, and
wherein an angle between the first port and the second port is provided as an obtuse angle.

10. The substrate treating apparatus of claim 9, wherein a length of the first port in a vertical direction is provided to be less than an inner diameter of a discharge end of the nozzle.

11. The substrate treating apparatus of claim 1, wherein the treatment liquid includes photoresist, and the cleaning liquid includes thinner.

12. A substrate treating apparatus comprising:
a treating container having a treatment space to treat a substrate;
a standby port positioned at one side of the treating container to allow a nozzle, which discharges a treatment liquid, to stand by; and
a liquid supplying unit having the nozzle and moving between the treating container and the standby port, wherein the standby port includes:
a nozzle receiving member including a nozzle cleaning unit having a receiving space formed inside the nozzle cleaning unit to receive the nozzle and a cleaning liquid; and
a discharge part having a discharge port provided at one side of the nozzle cleaning unit to supply the cleaning liquid to the nozzle,
wherein the discharge port is provided to overlap at least a portion of the nozzle and provided at one side from a central axis of the nozzle, when viewed from above,
wherein the nozzle receiving member includes an anti-movement groove extending in a bottom surface of the nozzle receiving member, and
wherein the anti-movement groove extends along a circumference of the nozzle cleaning unit to prevent the cleaning liquid from moving left or right when the cleaning liquid is drained.

13. The substrate treating apparatus of claim 12, wherein the cleaning liquid supplied from the discharge port rotates along an outer surface of the nozzle, and
wherein the cleaning liquid rotates to a surface, which is positioned at an opposite side in a direction of the discharge port, of the outer surface of the nozzle.

14. The substrate treating apparatus of 12, wherein a plurality of nozzle cleaning units, each including the nozzle cleaning unit, are provided, positioned to be mutually independent from each other, and arranged in one direction, when viewed from above.

15. The substrate treating apparatus of claim 14, wherein the standby port includes:
a plurality of anti-overflow holes provided to communicate with the plurality of nozzle cleaning units in a direction perpendicular to an arrangement direction of the plurality of nozzle cleaning units, and
wherein the anti-movement groove extends along a circumference of the anti-overflow holes.

16. The substrate treating apparatus of claim 12, wherein the standby port includes:
a pipe fixing member coupled to the nozzle receiving member to fix a cleaning liquid supplying pipe to supply the cleaning liquid to the discharge port,
wherein the pipe fixing member includes a pipe insertion hole into which the cleaning liquid supplying pipe is inserted, and an anti-leakage groove (structure) formed in the pipe insertion hole.

17. The substrate treating apparatus of claim 12, wherein the treatment liquid includes photoresist, and the cleaning liquid includes thinner.

* * * * *